US012580034B2

(12) United States Patent
Lee

(10) Patent No.: US 12,580,034 B2
(45) Date of Patent: Mar. 17, 2026

(54) MEMORY DEVICE AND METHOD OF FABRICATING MEMORY DEVICE INCLUDING A TEST CIRCUIT

(71) Applicant: Samsung Electronics Co., Ltd., Suwon-si (KR)

(72) Inventor: Jungpil Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 162 days.

(21) Appl. No.: 18/383,603

(22) Filed: Oct. 25, 2023

(65) Prior Publication Data
US 2024/0282395 A1    Aug. 22, 2024

(30) Foreign Application Priority Data
Feb. 21, 2023    (KR) ........................ 10-2023-0023129

(51) Int. Cl.
| | |
|---|---|
| *G11C 29/00* | (2006.01) |
| *G11C 5/06* | (2006.01) |
| *G11C 16/04* | (2006.01) |
| *G11C 16/08* | (2006.01) |
| *G11C 29/12* | (2006.01) |
| *H10B 43/27* | (2023.01) |
| *H10B 43/35* | (2023.01) |
| *H10B 43/40* | (2023.01) |

(52) U.S. Cl.
CPC .......... *G11C 29/1201* (2013.01); *G11C 5/063* (2013.01); *G11C 16/0483* (2013.01); *G11C 16/08* (2013.01); *H10B 43/27* (2023.02); *H10B 43/35* (2023.02); *H10B 43/40* (2023.02)

(58) Field of Classification Search
CPC . G11C 29/1201; G11C 5/063; G11C 16/0483; G11C 16/08; G11C 29/025; G11C 16/10; G11C 29/18; G11C 29/56004; H10B 43/27; H10B 43/35; H10B 43/40; H01L 22/22
USPC ........................................................ 365/201
See application file for complete search history.

(56) References Cited

U.S. PATENT DOCUMENTS

| | | | | |
|---|---|---|---|---|
| 11,348,848 | B2 * | 5/2022 | Kim | ........................ H01L 24/05 |
| 11,367,504 | B2 | 6/2022 | Oh | |
| 11,387,154 | B2 | 7/2022 | Oh | |
| 11,721,655 | B2 * | 8/2023 | Park | ........................ G11C 5/025 |
| | | | | 257/48 |
| 2016/0020158 | A1 | 1/2016 | Tekumalla et al. | |
| 2022/0149012 | A1 | 5/2022 | Or-Bach et al. | |

(Continued)

FOREIGN PATENT DOCUMENTS

KR            10-2398666  B1      5/2022

*Primary Examiner* — Tha-O H Bui
(74) *Attorney, Agent, or Firm* — Muir Patent Law, PLLC

(57) ABSTRACT

A memory device which including a memory chip that includes a memory cell array connected to word lines and bit lines, a test circuit connected to the word lines and the bit lines, and a first bonding metal pattern connected to the word lines and the bit lines, and a peripheral circuit chip that includes a peripheral circuit and a second bonding metal pattern. The test circuit performs a test process on the memory cell array, and the memory chip and the peripheral circuit chip are connected in a bonding method for electrically connecting the first bonding metal pattern and the second bonding metal pattern.

20 Claims, 16 Drawing Sheets

(56) References Cited

U.S. PATENT DOCUMENTS

| | | |
|---|---|---|
| 2022/0157754 A1 | 5/2022 | Park et al. |
| 2022/0223552 A1 | 7/2022 | Yoshimizu et al. |

* cited by examiner

MEMORY DEVICE AND METHOD OF FABRICATING MEMORY DEVICE INCLUDING A TEST CIRCUIT

CROSS-REFERENCE TO RELATED APPLICATIONS

This application claims priority under 35 U.S.C. § 119 to Korean Patent Application No. 10-2023-0023129 filed on Feb. 21, 2023, in the Korean Intellectual Property Office, the disclosure of which is incorporated by reference herein in its entirety.

BACKGROUND

Embodiments of the present disclosure described herein relate to a memory device, and more particularly, relate to a memory device including a memory chip and a peripheral circuit chip and a method of fabricating the memory device.

Nowadays, as information communication devices support various functions, a high-capacity and highly-integrated memory device is required. To this end, there is being developed a memory device that includes a three-dimensional memory cell array in which a plurality of memory cells are respectively connected to word lines stacked in a direction perpendicular to a substrate. Also, to reduce the size of the memory device including the three-dimensional memory cell array, various memory devices in which the three-dimensional memory cell array and a peripheral circuit are vertically disposed are being developed.

SUMMARY

Embodiments of the present disclosure provide a memory device capable of improving a memory device yield by performing a test process on a memory chip before bonding the memory chip to a peripheral circuit chip.

According to an embodiment, a memory device includes a memory chip that includes a memory cell array connected to word lines and bit lines, a test circuit connected to the word lines and the bit lines, and a first bonding metal pattern connected to the word lines and the bit lines, and a peripheral circuit chip that includes a peripheral circuit and a second bonding metal pattern. The test circuit performs a test process on the memory cell array, and the memory chip and the peripheral circuit chip are connected in a bonding method for electrically connecting the first bonding metal pattern and the second bonding metal pattern.

According to an embodiment, a memory chip includes a cell array placement region in which a memory cell array including word lines and bit lines is disposed, a test circuit region in which a test circuit configured to perform a test process on the memory cell array is disposed, and a bit line connection line provided on the bit lines. The test circuit is electrically connected to the bit lines through the bit line connection line, and the bit line connection line extends from the cell array placement region to at least a portion of the test circuit region.

According to an embodiment, a method of fabricating a memory device includes fabricating a memory chip including a memory cell array and a test circuit, fabricating a peripheral circuit chip including a peripheral circuit, performing a test process on the memory cell array, and bonding the peripheral circuit chip and the memory chip together to fabricate the memory device, when the memory chip passes the test process.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
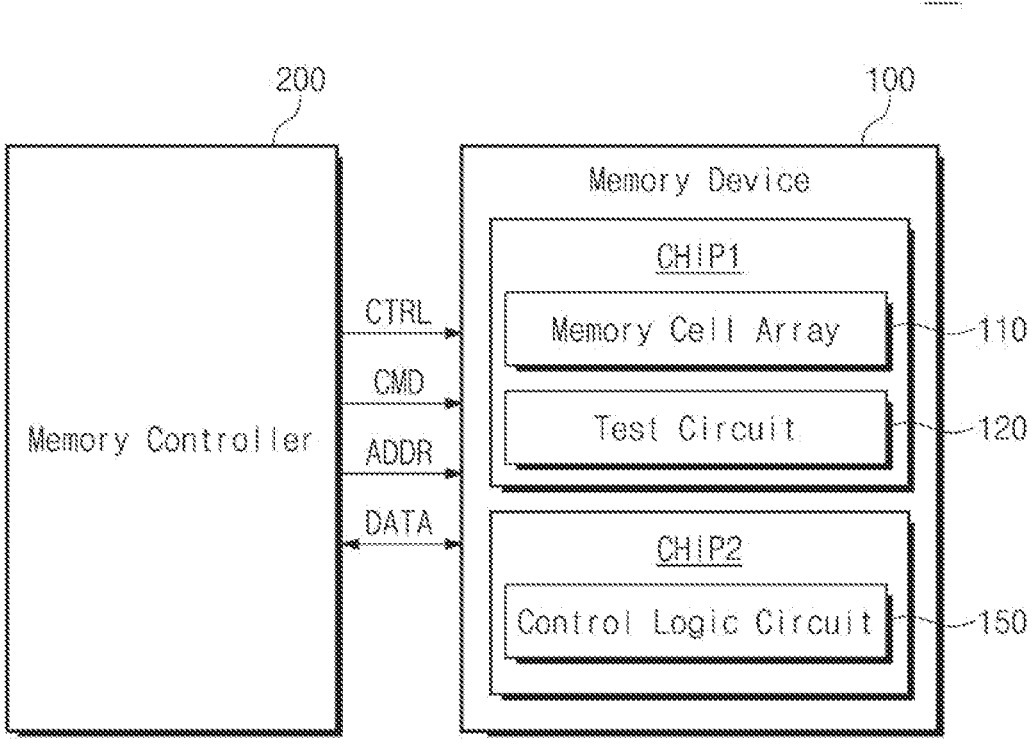
FIG. 1 is a block diagram illustrating a memory system according to an example embodiment of the present disclosure.

Below, embodiments of the present disclosure will be described in detail and clearly to such an extent that an ordinary one in the art easily carries out the present disclosure. Like reference characters refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

FIG. 1 is a block diagram illustrating a memory system according to an example embodiment of the present disclosure.

Referring to FIG. 1, a memory system 10 may include a memory device 100 and a memory controller 200. For example, the memory system 10 may be included or mounted in electronic devices such as a personal computer, a server, a data center, a smartphone, a tablet PC, an autonomous vehicle, a personal game console, and a wearable device. For example, the memory system 10 may be implemented with a storage device such as a solid state drive (SSD).

The memory controller 200 may control an overall operation of the memory device 100. In detail, the memory controller 200 may control the memory device 100 by providing a control signal CTRL, a command CMD, and/or an address ADDR to the memory device 100. In an embodiment, based on a request from an external host, the memory controller 200 may control the memory device 100 to cause the memory device 100 to store the data DATA or to output the data DATA.

The memory device 100 may include a memory chip CHIP1 and a peripheral circuit chip CHIP2, and the memory chip CHIP1 and the peripheral circuit chip CHIP2 may be connected to each other in the bonding method discussed herein. The memory device 100 may operate under control of the memory controller 200. In an embodiment, the memory device 100 may output the stored data DATA under control of the memory controller 200 or may store the data DATA provided from the memory controller 200.

The memory chip CHIP1 may include a memory cell array 110, and the memory cell array 110 may include a plurality of planes. Each plane may include a plurality of memory blocks. Each memory block may include vertical NAND strings (e.g., NAND strings NS11 to NS33 of FIG. 4). In this case, the memory cell array 110 may be referred to as a "three-dimensional cell array" or a "three-dimensional memory cell array".

Each vertical NAND string may include memory cells respectively connected to word lines WLs vertically stacked on a substrate, which will be described in detail with reference to FIGS. 3 to 6.

Each memory cell may store one or more bits; in detail, each memory cell may be used as a single level cell (SLC), a multi-level cell (MLC), a triple level cell (TLC), or a quadruple level cell (QLC). Some of the plurality of memory blocks (e.g., memory blocks BLK1 to BLKz of FIG. 3) may be SLC blocks, and the others thereof may be MLC, TLC, or QLC blocks.

In an embodiment, the memory cells of the memory cell array 110 may be resistance random access memory (RRAM) cells, ferroelectric random access memory (FRAM) cells, phase change random access memory (PRAM) cells, thyristor random access memory (TRAM) cells, magnetic random access memory (MRAM) cells, or dynamic random access memory (DRAM) cells. Below, embodiments of the present disclosure will be described based on an embodiment where memory cells are NAND flash memory cells.

The memory chip CHIP1 may further include a test circuit 120. The test circuit 120 may be connected to word lines (e.g., word lines WLs of FIG. 2) and bit lines (e.g., bit lines BLs of FIG. 2) of the memory cell array 110.

The test circuit 120 may be configured to perform the test process on the memory cell array 110. The test process may include an electrical die sorting (EDS) process.

According to an embodiment of the present disclosure, the test process using the test circuit 120 may be performed before bonding the peripheral circuit chip CHIP2. As such, the peripheral circuit chip CHIP2 may be bonded to the memory chip CHIP1 determined to be good, and the memory device yield may be improved.

Figure 2:
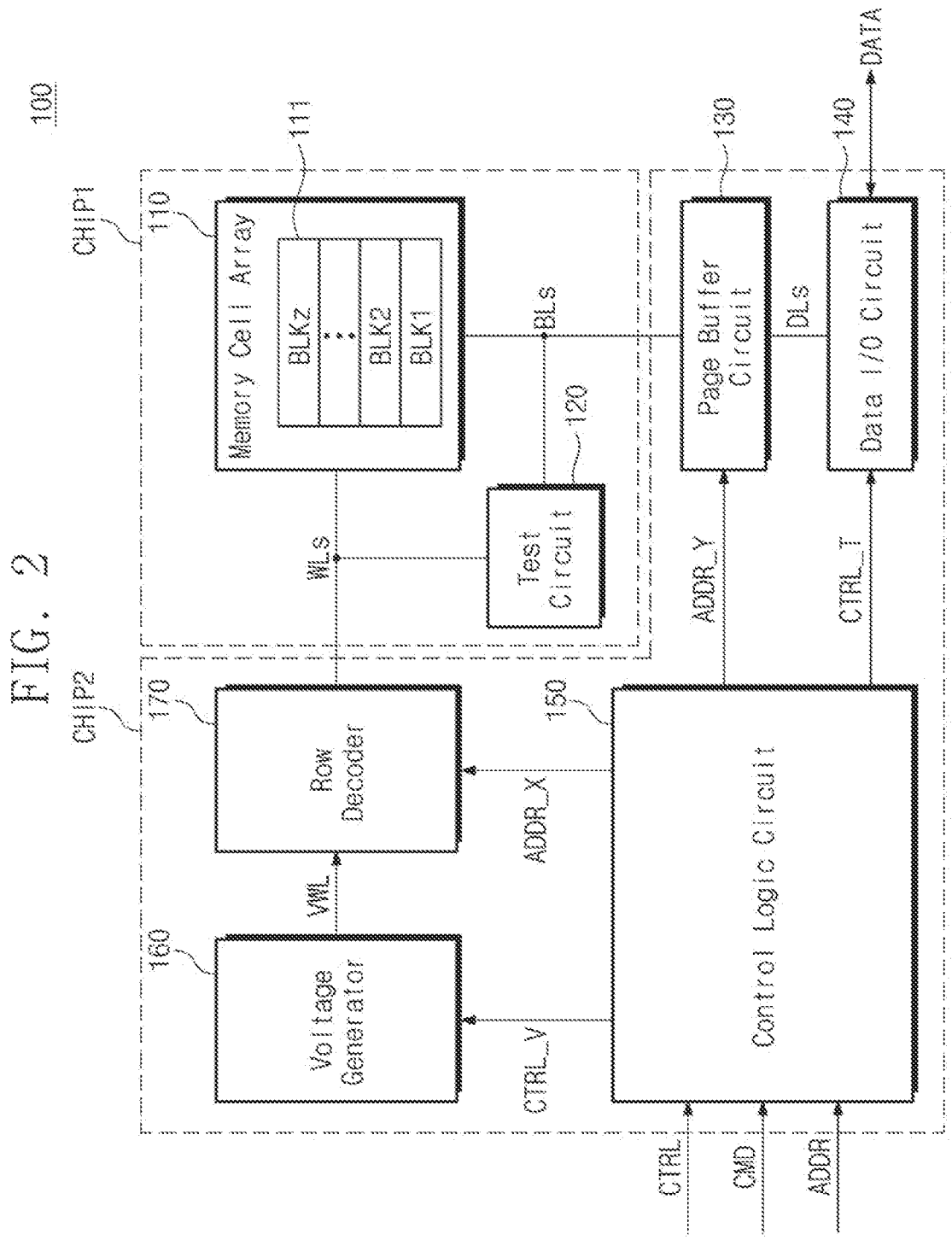
FIG. 2 is a block diagram illustrating a memory device according to an example embodiment of the present disclosure.

FIG. 2 is a block diagram illustrating a memory device according to an example embodiment of the present disclosure.

Referring to FIGS. 1 and 2, the memory device 100 may include the memory cell array 110, the test circuit 120, a page buffer circuit 130, a data input/output circuit 140, a control logic circuit 150, a voltage generator 160, and a row decoder 170. In an embodiment, the memory cell array 110 and the test circuit 120 may be disposed in the memory chip CHIP1, and the page buffer circuit 130, the data input/output circuit 140, the control logic circuit 150, the voltage generator 160, and the row decoder 170 may be disposed in the peripheral circuit chip CHIP2. According to an embodiment, the page buffer circuit 130, the data input/output circuit 140, the control logic circuit 150, the voltage generator 160, and the row decoder 170 that are disposed in the peripheral circuit chip CHIP2 may be referred to as "peripheral circuits". In embodiments of the present disclosure, the memory device 100 may be a nonvolatile memory device, and below, the "memory device 100" may refer to a nonvolatile memory device.

The memory cell array 110 may include a plane 111. The plane 111 may include a plurality of memory blocks BLK1 to BLKz (z being a positive integer). Each of the plurality of memory blocks BLK1 to BLKz may include a plurality of memory cells. The memory cell array 110 may be connected to the page buffer circuit 130 through the bit lines BLs and may be connected to the row decoder 170 through the word lines WLs.

The test circuit 120 may be connected to the memory cell array 110 through the word lines WLs and the bit lines BLs. The test circuit 120 may be used to perform the test process on the memory cell array 110. The test process of the test circuit 120 may be performed before bonding the peripheral circuit chip CHIP2.

In an embodiment, the test circuit 120 may include test pads. The test circuit 120 may receive a control signal for performing the test process from an external test device through the test pads. In another embodiment, the test pads may be disposed on the outside of the test circuit 120 so to be spaced apart therefrom.

The test circuit 120 may be configured to perform the test process on the memory cell array 110 in response to the control signal and to output a test result to the external test device through the test pads. A configuration and an operation of the test circuit 120 will be described in detail with reference to FIG. 9.

After bonding the memory chip CHIP1 and the peripheral circuit chip CHIP2 together, based on the command CMD, the address ADDR, and the control signal CTRL, the control logic circuit 150 may generate various kinds of control signals for programming data in the memory cell array 110, reading data from the memory cell array 110, or erasing data stored in the memory cell array 110. For example, the control logic circuit 150 may output a row address ADDR_X and a column address ADDR_Y. As such, the control logic circuit 150 may overall control various kinds of operations of the memory device 100.

The voltage generator 160 may generate various kinds of voltages for performing the program, read, and erase operations on the memory cell array 110, based on a voltage control signal CTRL_V. In detail, the voltage generator 160 may generate a word line voltage VWL, for example, a program voltage, a read voltage, a pass voltage, an erase verify voltage, or a program verify voltage. Also, the voltage generator 160 may further generate a string selection line voltage and a ground selection line voltage based on the voltage control signal CTRL_V.

Based on the row address ADDR_X, the row decoder 170 may select one of the plurality of memory blocks BLK1 to BLKz and may select one of the word lines WLs and one of a plurality of string selection lines in the selected memory block.

The page buffer circuit 130 may be connected to the memory cell array 110 through the plurality of bit lines BLs. The page buffer circuit 130 may be configured to temporarily store the data DATA to be programmed in the memory cell array 110 or the data DATA read from the memory cell array 110.

The data input/output circuit 140 may provide the data DATA received from the memory controller 200 to the page buffer circuit 130 through data lines DLs or may provide the data DATA received through the data lines DLs to the memory controller 200. The data input/output circuit 140 may operate in response to the control signal CTR_T received from the control logic circuit 150.

Figure 3:
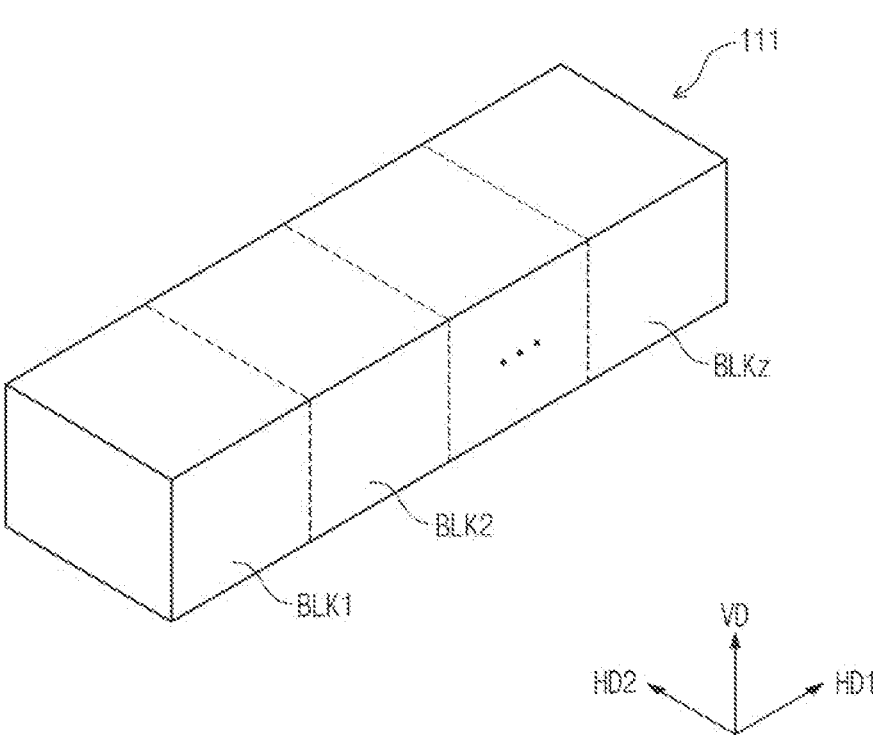
FIG. 3 illustrates one plane of a memory cell array according to an example embodiment of the present disclosure.

FIG. 3 illustrates one plane of a memory cell array according to an example embodiment of the present disclosure.

Referring to FIG. 3, the plane 111 of the memory cell array 110 may include the plurality of memory blocks BLK1 to BLKz. Herein, "z" may be a positive integer. Each of the plurality of memory blocks BLK1 to BLKz may have a three-dimensional structure (or a vertical structure). In detail, each of the plurality of memory blocks BLK1 to BLKz may include a plurality of NAND strings extending in a vertical direction VD. In this case, the plurality of NAND strings may be provided to be spaced apart from each other in first and second horizontal directions HD1 and HD2 as much as a specific distance. The plurality of memory blocks BLK1 to BLKz may be selected by the row decoder 170 (refer to FIG. 2). For example, the row decoder 170 may select a memory block corresponding to a block address from among the plurality of memory blocks BLK1 to BLKz.

Figure 4:
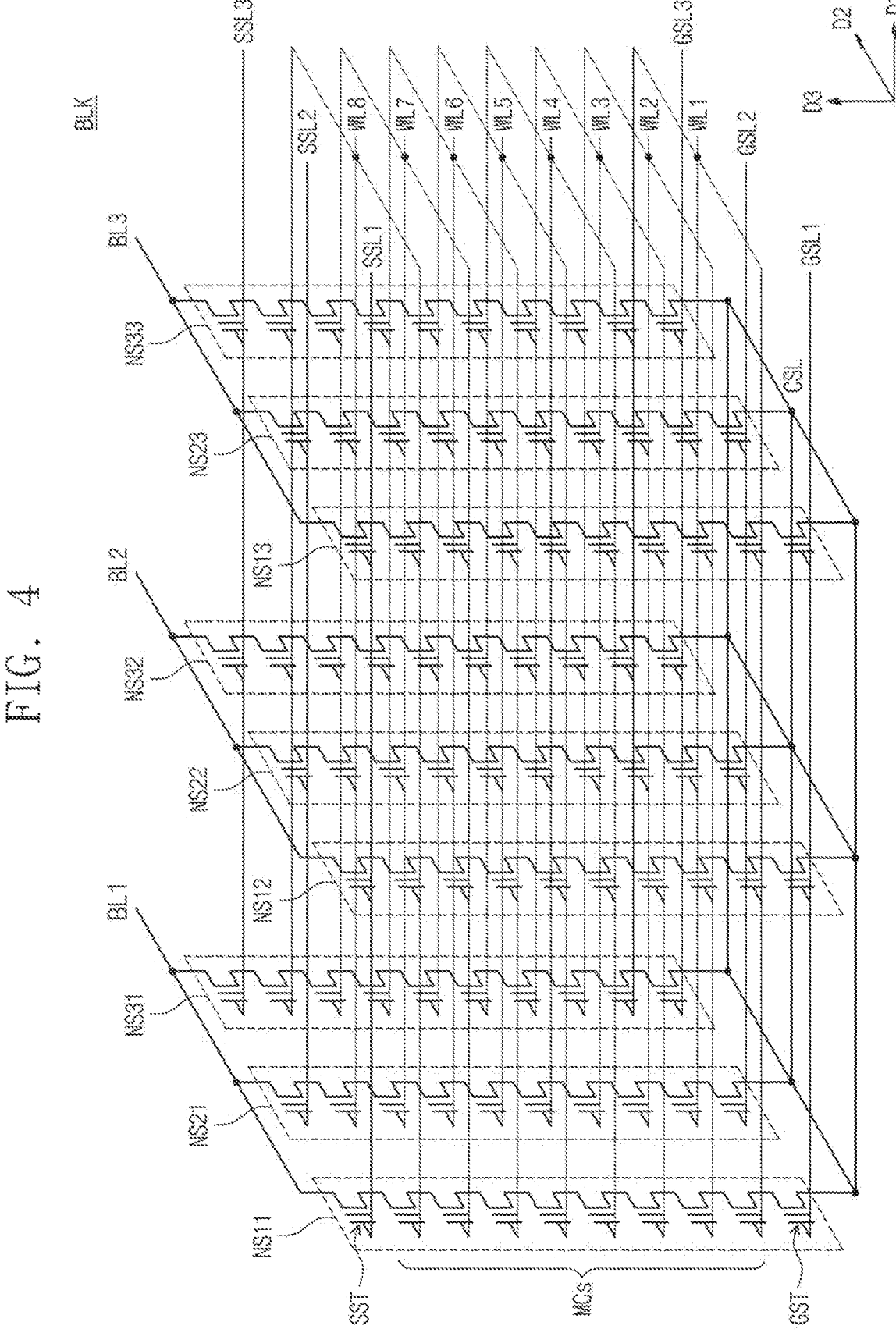
FIG. 4 is a circuit diagram indicating a memory block according to an example embodiment of the present disclosure.

FIG. 4 is a circuit diagram indicating a memory block according to an example embodiment of the present disclosure.

A memory block BLK of FIG. 4 may correspond to one of the plurality of memory blocks BLK1 to BLKz of FIG. 3. The memory block BLK may include NAND strings NS11 to NS33, and each NAND string (see, e.g., NAND string NS11) may include a string selection transistor SST, a plurality of memory cells MCs, and a ground selection transistor GST that are connected in series. The transistors SST and GST and the memory cells MCs included in each NAND string may form a structure in which the transistors SST and GST and the memory cells MCs are stacked on a substrate in a vertical direction.

Word lines WL1 to WL8 may extend along a first direction D1, and bit lines BL1 to BL3 may extend along a second direction D2. The NAND strings NS11, NS21, and NS31 may be provided between the first bit line BL1 and a common source line CSL, the NAND strings NS12, NS22, and NS32 may be provided between the second bit line BL2 and the common source line CSL, and the NAND strings NS13, NS23, and NS33 may be provided between the third bit line BL3 and the common source line CSL. In each NAND string, the string selection transistor SST may be connected to a corresponding one of string selection lines SSL1, SSL2, and SSL3, and the memory cells MCs may be respectively connected to the word lines WL1 to WL8. In each NAND string, the ground selection transistor GST may be connected to a corresponding one of ground selection lines GSL1, GSL2, and GSL3. In each NAND string, the string selection transistor SST may be connected to the corresponding bit line, and the ground selection transistor GST may be connected to the common source line CSL. Here, the number of NAND strings, the number of word lines WLs, the number of bit lines BLs, the number of ground selection lines, and the number of string selection lines may be variously changed depending on embodiments.

Figure 5:
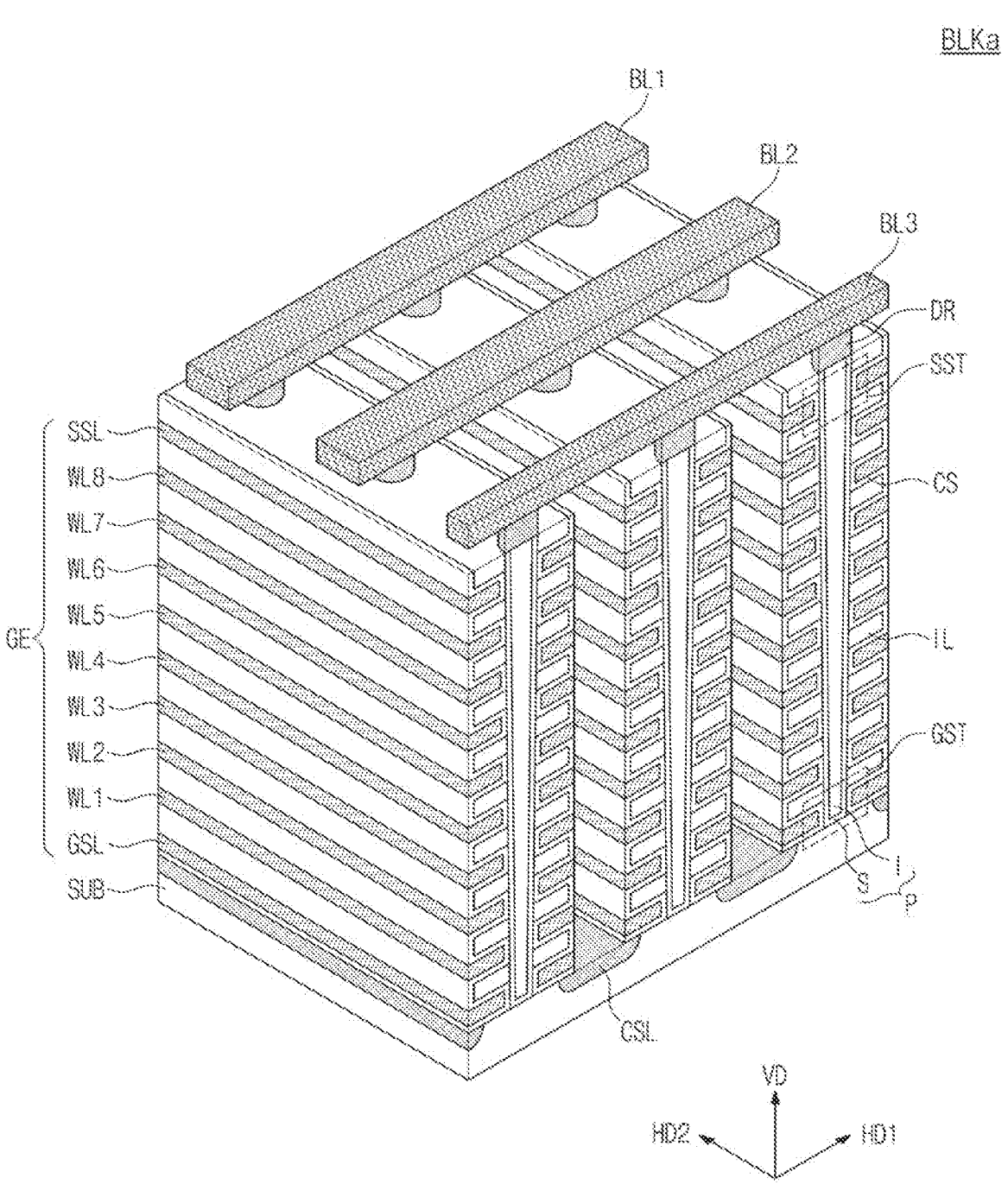
FIG. 5 is a perspective view illustrating a memory block according to an example embodiment of the present disclosure.

FIG. 5 is a perspective view illustrating a memory block according to an example embodiment of the present disclosure.

A memory block BLKa of FIG. 5 may correspond to one of the plurality of memory blocks BLK1 to BLKz of FIG. 3. The memory block BLKa may be formed in a direction perpendicular to a substrate SUB. The substrate SUB is of a first conductivity type (e.g., a p-type), and the common source line CSL that extends lengthwise along the second horizontal direction HD2 and is doped with impurities of a second conductivity type (e.g., an n-type) is provided on the substrate SUB. On a region of the substrate SUB between two adjacent common source lines CSL, a plurality of insulating layers IL that extend lengthwise along the second horizontal direction HD2 are sequentially provided along the vertical direction VD, and the plurality of insulating layers IL are spaced from each other along the vertical direction VD as much as a specific distance. For example, each of the plurality of insulating layers IL may include an insulating material such as silicon oxide.

A plurality of pillars P that are sequentially disposed along the first horizontal direction HD1 and penetrate the plurality of insulating layers IL along the vertical direction VD are provided on the region of the substrate SUB between the two adjacent common source lines CSL. For example, the plurality of pillars P may extend through the plurality of insulating layers IL and contact the substrate SUB. In detail, a surface layer S of each pillar P may include a silicon material of a first type and may function as a channel. Meanwhile, an inner layer I of each pillar P may include an insulating material such as silicon oxide or an air gap.

In the region between the two adjacent common source lines CSL, a charge storage layer CS may be provided along exposed surfaces of the insulating layers IL, the pillars P, and the substrate SUB. The charge storage layer CS may include a gate insulating layer (also referred to as a "tunneling insulating layer"), a charge trap layer, and a blocking insulating layer. For example, the charge storage layer CS may have an oxide-nitride-oxide (ONO) structure. Furthermore, in the region between the two adjacent common source lines CSL, gate electrodes GE such as the selection lines GSL and SSL and the word lines WL1 to WL8 may be provided on an exposed surface of the charge storage layer CS.

Drains or drain contacts DR may be provided on the plurality of pillars P, respectively. For example, each of the drains or drain contacts DR may include a silicon material that is doped with impurities of the second conductivity type. The bit lines BL1 to BL3 that extend lengthwise in the first horizontal direction HD1 and are spaced apart from each other along the second horizontal direction HD2 as much as a specific distance may be provided on the drains DR.

Figure 6:
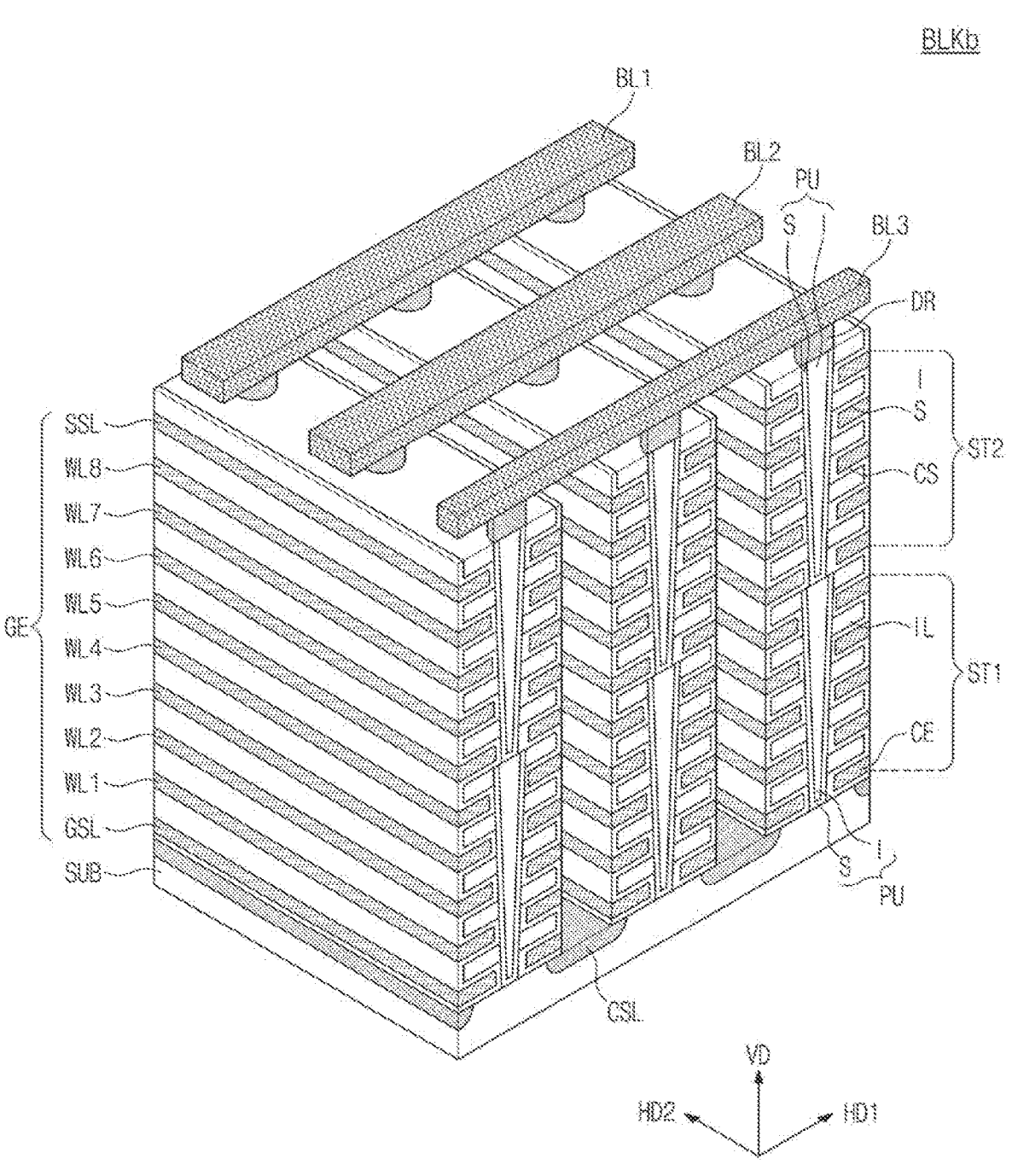
FIG. 6 is a perspective view illustrating a memory block according to an example embodiment of the present disclosure.

FIG. 6 is a perspective view illustrating a memory block according to an example embodiment of the present disclosure.

A memory block BLKb of FIG. 6 may correspond to one of the plurality of memory blocks BLK1 to BLKz of FIG. 3. Also, the memory block BLKb may correspond to a modified embodiment of the memory block BLKa of FIG. 5, and the description given with reference to FIG. 5 may be applied to the embodiment of FIG. 6, and duplicate descriptions will be not be repeated. The memory block BLKb may be formed in a direction perpendicular to the substrate SUB. The memory block BLKb may include a first memory stack ST1 and a second memory stack ST2 stacked in the vertical direction VD. The first memory stack ST1 may include gate electrodes GE such as the gate selection line GSL and the word lines WL1 to WL4, and the second memory stack ST2 may include gate electrodes GE such as the string selection line SSL and the word lines WL5 to WL8. In addition, the plurality of pillars P may include a plurality of lower pillars PL and a plurality of upper pillars PU formed on the plurality of lower pillars PL. For example, the first memory stack ST1 may include the plurality of lower pillars PL, and the second memory stack ST2 may include the plurality of upper pillars PU. Each of the lower pillars PL and the upper pillars PU may include a surface layer S, which may include a silicon material of a first type and may function as a channel, and an inner layer I, which may include an insulating material such as silicon oxide or an air gap. The plurality of lower pillars PL may extend through the plurality of insulating layers IL of the first memory stack ST1, and the plurality of upper pillars PU may extend through the plurality of insulating layers IL of the second memory stack ST2.

Figure 7:
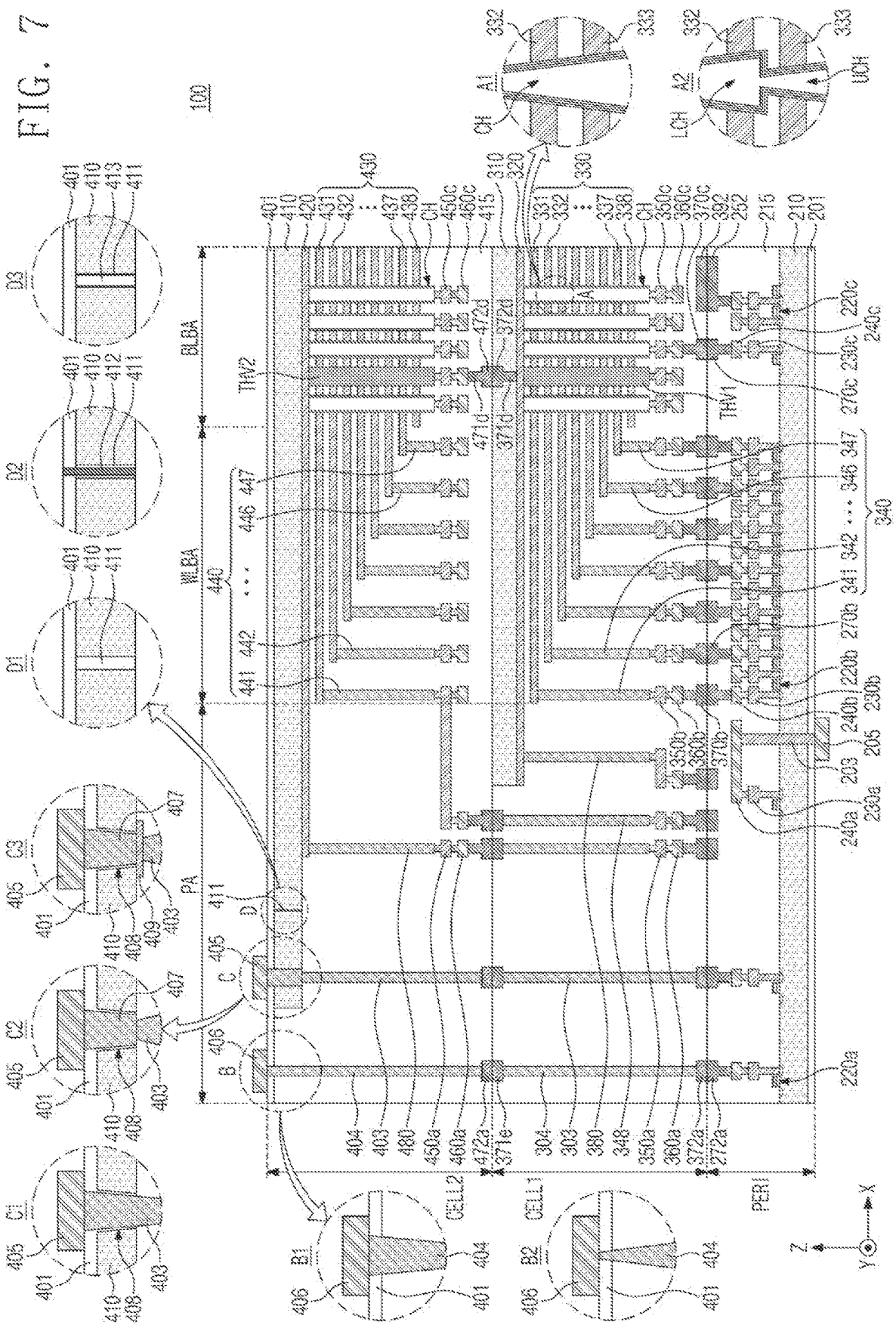
FIG. 7 is a diagram for describing a memory device according to an example embodiment of the present disclosure.

FIG. 7 is a view for describing a memory device according to an example embodiment of the present disclosure.

Referring to FIG. 7, the memory device 100 may have a chip-to-chip (C2C) structure. Herein, in the C2C structure, after fabricating at least one upper chip including a cell region CELL and at least one lower chip including a peripheral circuit region PERI, respectively, the upper chip and the lower chip may be bonded to each other by a bonding method. As an example, the bonding method may mean a method of electrically or physically connecting a bonding metal pattern formed in the uppermost metal layer of the upper chip and a bonding metal pattern formed in the uppermost metal layer of the lower chip. For example, when the bonding metal patterns are formed of copper (Cu), the bonding method may be referred to as a "Cu—Cu bonding method". As another example, the bonding metal patterns may also be formed of aluminum (Al) or tungsten (W).

The memory device 100 may include at least one upper chip including a cell region. For example, as illustrated in FIG. 7, the memory device 100 may be implemented to include two upper chips. However, this is illustrative, and the number of upper chips is not limited thereto. In the case in which the memory device 100 is implemented to include two upper chips, the memory device 100 may be manufactured by separately manufacturing a first upper chip including a first cell region CELL1, a second upper chip including a second cell region CELL2, and a lower chip including a peripheral circuit region PERI and thereafter connecting the first upper chip, the second upper chip, and the lower chip by a bonding method. The first upper chip may be turned over and connected to the lower chip by the bonding method, and the second upper chip may also be turned over and connected to the first upper chip by the bonding method. In the following description, upper portions and lower portions of the first and second upper chips are defined based on before the first upper chip and the second upper chip are turned over. For example, in FIG. 7, an upper portion of the lower chip including the peripheral circuit region PERI refers to an upper portion defined based on a +Z-axis direction, and the upper portions of the first and second upper chips including the first and second cell regions CELL1 and CELL2, respectively, refer to upper portions defined based on a −Z-axis direction. However, this is illustrative, and only one of the first upper chip and the second upper chip may be turned over and connected by the bonding method.

Each of the peripheral circuit region PERI and the first and second cell regions CELL1 and CELL2 of the memory device 100 may include an external pad bonding region PA, a word line bonding region WLBA, and a bit line bonding region BLBA.

The peripheral circuit region PERI may include a first substrate 210 and a plurality of circuit elements 220a, 220b, and 220c formed on the first substrate 210. An interlayer insulating layer 215 including one or more insulating layers may be provided on the plurality of circuit elements 220a, 220b, and 220c, and a plurality of metal lines connecting the plurality of circuit elements 220a, 220b, and 220c may be provided in the interlayer insulating layer 215. For example, the plurality of metal lines may include first metal lines 230a, 230b, and 230c connected with the plurality of circuit elements 220a, 220b, and 220c, respectively, and second metal lines 240a, 240b, and 240c formed on the first metal lines 230a, 230b, and 230c. The plurality of metal lines may be formed of at least one of various conductive materials. For example, the first metal lines 230a, 230b, and 230c may be formed of tungsten having a relatively high electrical resistivity, and the second metal lines 240a, 240b, and 240c may be formed of copper having a relatively low electrical resistivity.

In this specification, only the first metal lines 230a, 230b, and 230c and the second metal lines 240a, 240b, and 240c are illustrated and described. However, without being limited thereto, one or more additional metal lines may be further formed on the second metal lines 240a, 240b, and 240c. In this case, the second metal lines 240a, 240b, and 240c may be formed of aluminum, and at least some of the additional metal lines formed on the second metal lines 240a, 240b, and 240c may be formed of copper having a lower electrical resistivity than the aluminum of the second metal lines 240a, 240b, and 240c.

The interlayer insulating layer 215 may be disposed on the first substrate 210 and may include an insulating material, such as silicon oxide or silicon nitride.

Each of the first and second cell regions CELL1 and CELL2 may include at least one memory block. The first cell region CELL1 may include a second substrate 310 and a common source line 320. A plurality of word lines 330 (e.g., word lines 331 to 338) may be stacked on the second substrate 310 in a direction (the Z-axis direction) perpendicular to an upper surface of the second substrate 310. Although not illustrated, string selection lines and a ground selection line may be disposed on and under the word lines 330 (e.g., on the word line 338 and under the word line 331), and the plurality of word lines 330 may be disposed between the string selection lines and the ground selection line. Likewise, the second cell region CELL2 may include a third substrate 410 and a common source line 420, and a plurality of word lines 430 (431 to 438) may be stacked in a direction (the Z-axis direction) perpendicular to an upper surface of the third substrate 410. Although not illustrated, string selection lines and a ground selection line may be disposed on and under the word lines 430 (e.g., on the word line 438 and under the word line 431), and the plurality of word lines 430 may be disposed between the string selection lines and the ground selection line. The second substrate 310 and the third substrate 410 may be formed of various materials and may be, for example, silicon substrates, silicon-germanium substrates, germanium substrates, or substrates having mono-crystalline epitaxial layers grown on mono-crystalline silicon substrates. A plurality of channel structures CH may be formed in the first and second cell regions CELL1 and CELL2.

In an embodiment, as illustrated in A1, the channel structure CH may be provided in the bit line bonding region BLBA and may extend in the direction perpendicular to the upper surface of the second substrate 310 to penetrate the word lines 330, the string selection lines, and the ground selection line. The channel structure CH may include a data storage layer, a channel layer, and a buried insulating layer. The channel layer may be electrically connected with a first metal line 350c and a second metal line 360c in the bit line bonding region BLBA. For example, the second metal line 360c may be a bit line and may be connected to the channel structure CH through the first metal line 350c. The second metal line 360c may extend in a first direction (a Y-axis direction) parallel to the upper surface of the second substrate 310.

In an embodiment, as illustrated in A2, the channel structure CH may include a lower channel LCH and an upper channel UCH connected to each other. For example, the channel structure CH may be formed through a process for the lower channel LCH and a process for the upper channel UCH. The lower channel LCH may extend in the direction perpendicular to the upper surface of the second substrate 310 and may penetrate the common source line 320 and the lower word lines 331 and 332. The lower channel LCH may include a data storage layer, a channel layer, and a buried insulating layer and may be connected with the upper channel UCH. The upper channel UCH may penetrate the upper word lines 333 to 338. The upper channel UCH may include a data storage layer, a channel layer, and a buried insulating layer, and the channel layer of the upper channel UCH may be electrically connected with the first metal line 350c and the second metal line 360c. As the length of a channel is increased, it may be difficult to form a channel having a constant width due to process reasons. The memory device 100 according to an embodiment of the present disclosure may include a channel having improved width uniformity through the lower channel LCH and the upper channel UCH formed by sequential processes.

In the case in which the channel structure CH includes the lower channel LCH and the upper channel UCH as illustrated in A2, a word line located near the boundary between the lower channel LCH and the upper channel UCH may be a dummy word line. For example, the word line 332 and the word line 333 that form the boundary between the lower channel LCH and the upper channel UCH may be dummy word lines. In this case, data may not be stored in memory cells connected to the dummy word lines. Alternatively, the number of pages corresponding to the memory cells connected to the dummy word lines may be smaller than the number of pages corresponding to memory cells connected to normal word lines. A voltage level applied to the dummy word lines may differ from a voltage level applied to the normal word lines, and thus an influence of a non-uniform channel width between the lower channel LCH and the upper channel UCH on an operation of the memory device may be reduced.

Meanwhile, it is illustrated in A2 that the number of lower word lines 331 and 332 penetrated by the lower channel LCH is smaller than the number of upper word lines 333 to 338 penetrated by the upper channel UCH. However, this is illustrative, and the present disclosure is not limited thereto. In another example, the number of lower word lines penetrated by the lower channel LCH may be equal to or larger than the number of upper word lines penetrated by the upper channel UCH. Furthermore, the above-described structure and connection relationship of the channel structure CH disposed in the first cell region CELL1 may be identically applied to the channel structure CH disposed in the second cell region CELL2.

In the bit line bonding region BLBA, a first through-electrode THV1 may be provided in the first cell region CELL1, and a second through-electrode THV2 may be provided in the second cell region CELL2. As illustrated in FIG. 7, the first through-electrode THV1 may penetrate the common source line 320 and the plurality of word lines 330. However, this is illustrative, and the first through-electrode THV1 may additionally penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In an embodiment, the first through-electrode THV1 and the second through-electrode THV2 may be electrically connected through a first through-metal pattern 372d and a second through-metal pattern 472d. The first through-metal pattern 372d may be formed on a lower side of the first upper chip including the first cell region CELL1, and the second through-metal pattern 472d may be formed on an upper side of the second upper chip including the second cell region CELL2. The first through-electrode THV1 may be electrically connected with the first metal line 350c and the second metal line 360c. A lower VIA 371d may be formed between the first through-electrode THV1 and the first through-metal pattern 372d, and an upper VIA 471d may be formed between the second through-electrode THV2 and the second through-metal pattern 472d. The first through-metal pattern 372d and the second through-metal pattern 472d may be connected by a bonding method.

Furthermore, in the bit line bonding region BLBA, an upper metal pattern 252 may be formed on the uppermost metal layer of the peripheral circuit region PERI, and an upper metal pattern 392 having the same shape as the upper metal pattern 252 may be formed on the uppermost metal layer of the first cell region CELL1. The upper metal pattern 392 of the first cell region CELL1 and the upper metal pattern 252 of the peripheral circuit region PERI may be electrically connected to each other by a bonding method. In the bit line bonding region BLBA, the second metal line 360c may be electrically connected with a page buffer included in the peripheral circuit region PERI. For example, some of the circuit elements 220c of the peripheral circuit region PERI may provide a page buffer, and the second metal line 360c may be electrically connected with the circuit elements 220c providing the page buffer through an upper bonding metal 370c of the first cell region CELL1 and an upper bonding metal 270c of the peripheral circuit region PERI.

Continuously referring to FIG. 7, in the word line bonding region WLBA, the word lines 330 of the first cell region CELL1 may extend in a second direction (an X-axis direction) parallel to the upper surface of the second substrate 310 and may be connected with a plurality of cell contact plugs 340 (e.g., cell contact plugs 341 to 347). A first metal line 350b and a second metal line 360b may be sequentially connected to upper portions of the cell contact plugs 340 connected to the word lines 330. In the word line bonding region WLBA, the cell contact plugs 340 may be connected with the peripheral circuit region PERI through an upper bonding metal 370b of the first cell region CELL1 and an upper bonding metal 270b of the peripheral circuit region PERI.

The cell contact plugs 340 may be electrically connected with a row decoder included in the peripheral circuit region PERI. For example, some of the circuit elements 220b of the peripheral circuit region PERI may provide a row decoder, and the cell contact plugs 340 may be electrically connected with the circuit elements 220b providing the row decoder through the upper bonding metal 370b of the first cell region CELL1 and the upper bonding metal 270b of the peripheral circuit region PERI. In an embodiment, an operating voltage of the circuit elements 220b that provide the row decoder may differ from an operating voltage of the circuit elements 220c that provide the page buffer. For example, the operating voltage of the circuit elements 220c that provide the page buffer may be greater than the operating voltage of the circuit elements 220b that provide the row decoder.

Likewise, in the word line bonding region WLBA, the word lines 430 of the second cell region CELL2 may extend in the second direction (the X-axis direction) parallel to the upper surface of the third substrate 410 and may be connected with a plurality of cell contact plugs 440 (e.g., cell contact plugs 441 to 447). The cell contact plugs 440 may be connected with the peripheral circuit region PERI through an upper metal pattern of the second cell region CELL2, a lower metal pattern and an upper metal pattern of the first cell region CELL1, and a cell contact plug 348.

In the word line bonding region WLBA, the upper bonding metal 370b may be formed in the first cell region CELL1, and the upper bonding metal 270b may be formed in the peripheral circuit region PERI. The upper bonding metal 370b of the first cell region CELL1 and the upper bonding metal 270b of the peripheral circuit region PERI may be electrically connected to each other by a bonding method. The upper bonding metal 370b and the upper bonding metal 270b may be formed of aluminum, copper, or tungsten.

In the external pad bonding region PA, a lower metal pattern 371e may be formed on a lower portion of the first cell region CELL1, and an upper metal pattern 472a may be formed on an upper portion of the second cell region CELL2. The lower metal pattern 371e of the first cell region CELL1 and the upper metal pattern 472a of the second cell region CELL2 may be connected by a bonding method in the external pad bonding region PA. Likewise, an upper metal pattern 372a may be formed on an upper portion of the first cell region CELL1, and an upper metal pattern 272a may be formed on an upper portion of the peripheral circuit region PERI. The upper metal pattern 372a of the first cell region CELL1 and the upper metal pattern 272a of the peripheral circuit region PERI may be connected to each other by a bonding method.

Common source line contact plugs 380 and 480 may be disposed in the external pad bonding region PA. The common source line contact plugs 380 and 480 may be formed of a conductive material, such as metal, a metal compound, or doped poly-silicon. The common source line contact plug 380 of the first cell region CELL1 may be electrically connected with the common source line 320, and the common source line contact plug 480 of the second cell region CELL2 may be electrically connected with the common source line 420. A first metal line 350a and a second metal line 360a may be sequentially stacked on an upper portion of the common source line contact plug 380 of the first cell region CELL1, and a first metal line 450a and a second metal line 460a may be sequentially stacked on an upper portion of the common source line contact plug 480 of the second cell region CELL2.

First to third input/output pads 205, 405, and 406 may be disposed in the external pad bonding region PA. Referring to FIG. 7, a lower insulating layer 201 may cover a lower surface of the first substrate 210, and the first input/output pad 205 may be formed on the lower insulating layer 201. The first input/output pad 205 may be connected with at least one of the plurality of circuit elements 220a disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 and may electrically isolate the first input/output contact plug 203 from the first substrate 210.

An upper insulating layer 401 may be formed on the third substrate 410 to cover the upper surface of the third substrate 410. The second input/output pad 405 and/or the third input/output pad 406 may be disposed on the upper insulating layer 401. The second input/output pad 405 may be connected with at least one of the plurality of circuit elements 220a disposed in the peripheral circuit region PERI through second input/output contact plugs 403 and 303, and the third input/output pad 406 may be connected with at least one of the plurality of circuit elements 220a disposed in the peripheral circuit region PERI through third input/output contact plugs 404 and 304.

In an example embodiment, the third substrate 410 may not be disposed in the regions in which the input/output contact plugs are disposed. For example, as illustrated in B, the third input/output contact plug 404 may be separated from the third substrate 410 in a direction parallel to the upper surface of the third substrate 410, may penetrate an interlayer insulating layer 415 of the second cell region CELL2, and may be connected to the third input/output pad 406. In this case, the third input/output contact plug 404 may be formed through various processes.

In another example embodiment, as illustrated in B1, the third input/output contact plug 404 may extend in the third direction (the Z-axis direction) and may have an increasing diameter toward the upper insulating layer 401. That is, while the channel structure CH described with reference to A1 has a decreasing diameter toward the upper insulating layer 401, the third input/output contact plug 404 may have an increasing diameter toward the upper insulating layer 401. For example, the third input/output contact plug 404 may be formed after the second cell region CELL2 and the first cell region CELL1 are coupled by a bonding method.

In a further example embodiment, as illustrated in B2, the third input/output contact plug 404 may extend in the third direction (the Z-axis direction) and may have a decreasing diameter toward the upper insulating layer 401. That is, likewise to the channel structure CH, the third input/output contact plug 404 may have a decreasing diameter toward the upper insulating layer 401. For example, the third input/output contact plug 404 may be formed together with the cell contact plugs 440 before the second cell region CELL2 and the first cell region CELL1 are coupled by a bonding method.

In an example embodiment, an input/output contact plug may be disposed to overlap the third substrate 410. For example, as illustrated in C, the second input/output contact plug 403 may be formed through the interlayer insulating layer 415 of the second cell region CELL2 in the third direction (the Z-axis direction) and may be electrically connected to the second input/output pad 405 through the third substrate 410. In this case, a connection structure of the second input/output contact plug 403 and the second input/output pad 405 may be implemented in various ways.

In another example embodiment, as illustrated in C1, an opening 408 may be formed through the third substrate 410, and the second input/output contact plug 403 may be directly connected to the second input/output pad 405 through the opening 408 formed in the third substrate 410. In this case, as illustrated in C1, the second input/output contact plug 403 may have an increasing diameter toward the second input/output pad 405. However, this is illustrative, and the second input/output contact plug 403 may have a decreasing diameter toward the second input/output pad 405.

In a further example embodiment, as illustrated in C2, the opening 408 may be formed through the third substrate 410, and a contact 407 may be formed in the opening 408. One end portion of the contact 407 may be connected to the second input/output pad 405, and an opposite end portion of the contact 407 may be connected to the second input/output contact plug 403. Accordingly, the second input/output contact plug 403 may be electrically connected to the second input/output contact plug 403 through the contact 407 in the opening 408. In this case, as illustrated in C2, the contact 407 may have an increasing diameter toward the second input/output pad 405, and the second input/output contact plug 403 may have a decreasing diameter toward the second input/output pad 405. For example, the third input/output contact plug 403 may be formed together with the cell contact plugs 440 before the second cell region CELL2 and the first cell region CELL1 are coupled by a bonding method, and the contact 407 may be formed after the second cell region CELL2 and the first cell region CELL1 are coupled by the bonding method.

In a still further example embodiment, as illustrated in C3, a stopper 409 may be additionally formed on an upper surface of the opening 408 of the third substrate 410. The stopper 409 may be a metal line formed on the same layer as the common source line 420. However, this is illustrative, and the stopper 409 may be a metal line formed on the same layer as at least one of the word lines 430. The second input/output contact plug 403 may be electrically connected to the second input/output pad 405 through the contact 407 and the stopper 409.

Meanwhile, similarly to the second and third input/output contact plugs 403 and 404 of the second cell region CELL2, the second and third input/output contact plugs 303 and 304 of the first cell region CELL1 may have a decreasing diameter toward the lower metal pattern 371e, or may have an increasing diameter toward the lower metal pattern 371e.

Meanwhile, in some embodiments, a slit 411 may be formed in the third substrate 410. For example, the slit 411 may be formed at any position in the external pad bonding region PA. For example, as illustrated in D, the slit 411 may be located between the second input/output pad 405 and the cell contact plugs 440 when viewed on a plane. However, this is illustrative, and the slit 411 may be formed such that the second input/output pad 405 is located between the slit 411 and the cell contact plugs 440 when viewed on the plane.

In an example embodiment, as illustrated in D1, the slit 411 may be formed through the third substrate 410. For example, the slit 411 may be used to prevent the third substrate 410 from being finely cracked when the opening 408 is formed. However, this is illustrative, and the slit 411 may be formed to have a depth ranging from about 60% to about 70% of the thickness of the third substrate 410.

In another example embodiment, as illustrated in D2, a conductive material 412 may be formed in the slit 411. For example, the conductive material 412 may be used to discharge a leakage current generated while circuit elements in the external pad bonding region PA are driven. In this case, the conductive material 412 may be connected to an external ground line.

In a further example embodiment, as illustrated in D3, an insulating material 413 may be formed in the slit 411. For example, the insulating material 413 may be formed to electrically isolate the second input/output pad 405 and the second input/output contact plug 403 disposed in the external pad bonding region PA from the word line bonding region WLBA. An influence of a voltage provided through the second input/output pad 405 on a metal layer disposed on the third substrate 410 in the word line bonding region WLBA may be interrupted by forming the insulating material 413 in the slit 411.

Meanwhile, in some embodiments, the first to third input/output pads 205, 405, and 406 may be selectively formed. For example, the memory device 100 may be implemented to include only the first input/output pad 205 disposed on the first substrate 210, only the second input/output pad 405 disposed on the third substrate 410, or only the third input/output pad 406 disposed on the upper insulating layer 401.

Meanwhile, in some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the peripheral circuit region PERI and the first cell region CELL1 are bonded to each other, and an insulating layer for covering an upper surface of the common source line 320 or a conductive layer for connection may be formed. Similarly, the third substrate 410 of the second cell region CELL2 may be removed before or after the first cell region CELL1 and the second cell region CELL2 are bonded to each other, and the upper insulating layer 401 for covering an upper surface of the common source line 420 or a conductive layer for connection may be formed.

Figure 8:
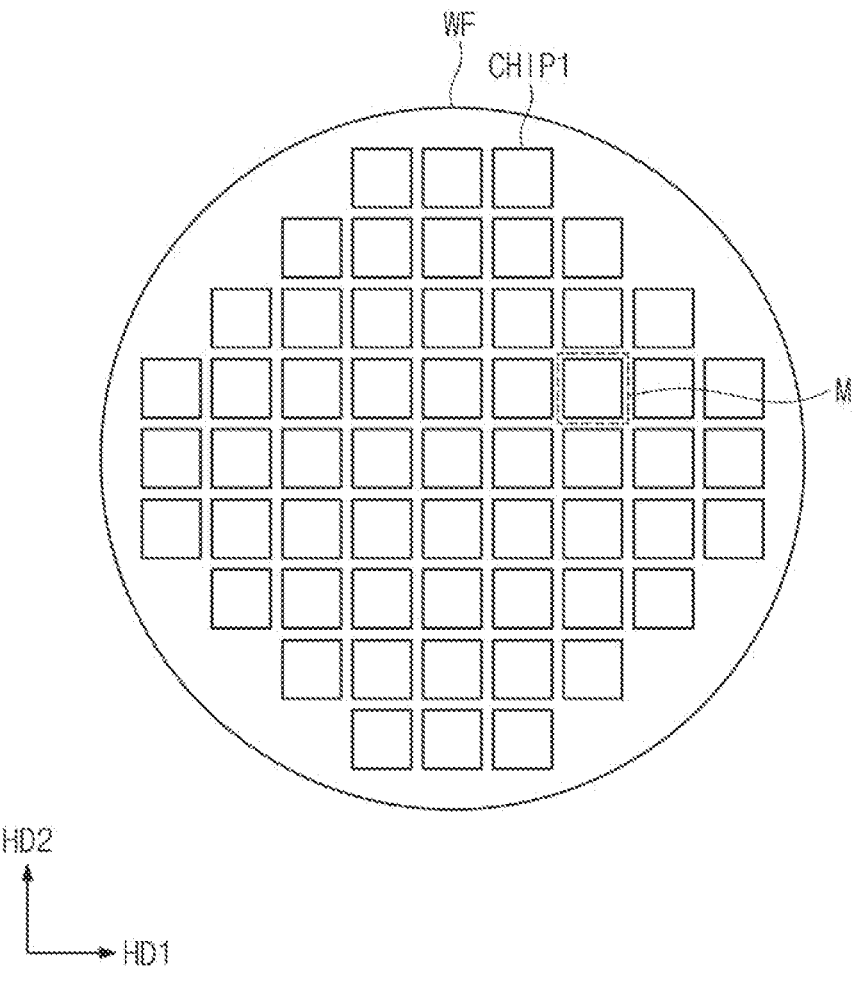
FIG. 8 is a diagram illustrating memory chips formed on a wafer according to an example embodiment of the present disclosure.
Figure 9:
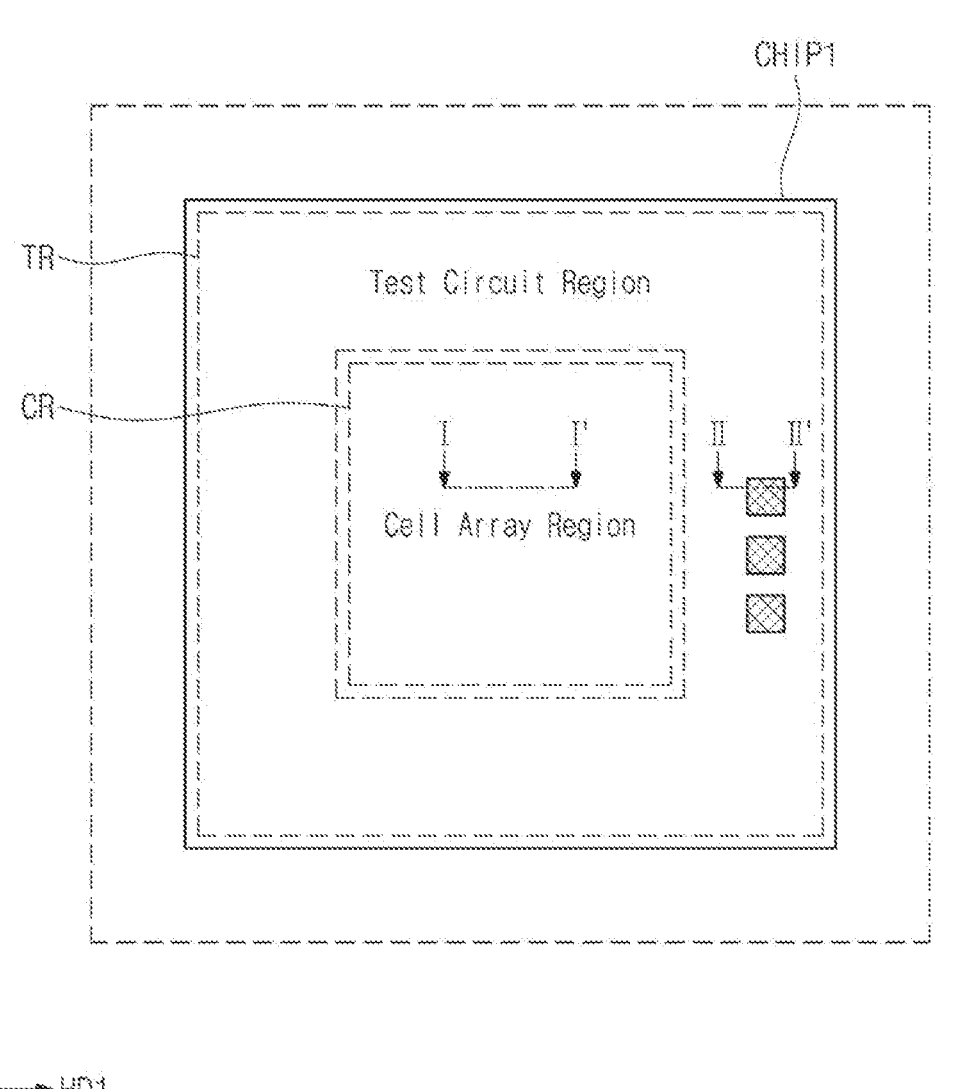
FIG. 9 is an enlarged view of a single memory chip in region "M" of FIG. 8.
Figure 10:
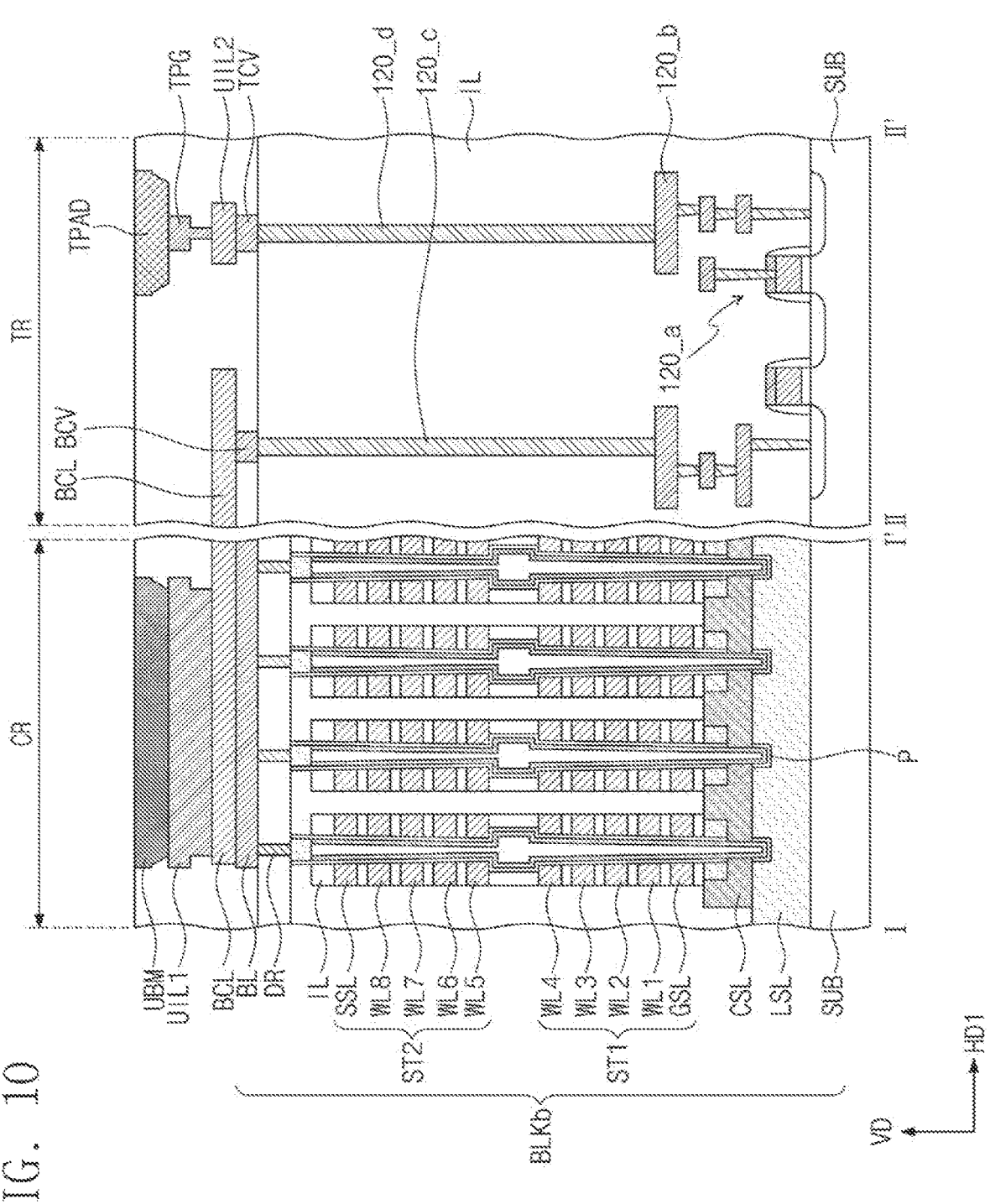
FIG. 10 is a view illustrating cross sections taken along line I-I' and line II-II' of FIG. 9.

FIG. 8 is a diagram illustrating memory chips formed on a wafer according to an example embodiment. FIG. 9 is an enlarged view of a single memory chip in region "M" of FIG. 8. FIG. 10 is a view illustrating cross sections taken along line I-I' and line II-II' of FIG. 9.

Referring to FIG. 8, a plurality of memory chips CHIP1 may be formed on a wafer WF. The memory chips CHIP1 may be arranged in the first horizontal direction HD1 and the second horizontal direction HD2. In an embodiment, each memory chip CHIP1 may be the memory chip CHIP1 of FIG. 1. In an embodiment, each memory chip CHIP1 may be the upper chip of FIG. 7.

Referring to FIG. 9, the memory chip CHIP1 may include a cell array placement region CR and a test circuit region TR.

In an embodiment, the cell array placement region CR may be located on the central portion of the memory chip CHIP1, and the test circuit region TR may be disposed to surround the cell array placement region CR. However, the present disclosure is not limited thereto. The test circuit region TR may be disposed adjacent to the cell array placement region CR.

Referring to FIG. 10, a memory cell array may be disposed in the cell array placement region CR. In an embodiment, a memory block (e.g., memory block BLKa of FIG. 5 or memory block BLKb of FIG. 6) may be disposed in the cell array placement region CR. In FIG. 10, the memory block BLKb of FIG. 6 is used as an example. The bit line BL may be disposed on the uppermost portion of the memory block.

A bit line connection line BCL may be provided on the bit line BL. The bit line connection line BCL may be electrically connected to the bit line BL. In an embodiment, the bit line connection line BCL may extend in a direction parallel to the bit line BL. For example, the bit line connection line BCL may be configured to extend lengthwise from the cell array placement region CR to at least a portion of the test circuit region TR.

A first upper line UIL1 and an upper boding metal UBM may be sequentially provided on the bit line connection line BCL The upper boding metal UBM may be provided for connection with the peripheral circuit chip CHIP2 including the peripheral circuit (e.g., in the bonding method) and may be the same as the upper bonding metal 370*c* of FIG. 7.

Continuously referring to FIG. 10, test circuit elements 120_*a* and test circuit lines (or wires) 120_*b* may be disposed in the test circuit region TR. The test circuit elements 120_*a* and the test circuit lines 120_*b* may be elements and lines constituting the test circuit 120 of FIG. 2. The test circuit elements 120_*a* and the test circuit lines 120_*b* may be provided on the substrate SUB.

In an embodiment, an operating voltage of the test circuit elements 120_*a* may be different from an operating voltage of the peripheral circuits included in the peripheral circuit chip CHIP2 of FIG. 2. For example, the operating voltage of the test circuit elements 120_*a* may be smaller than the operating voltage of the peripheral circuits.

An interlayer insulating layer IL including one or more insulating layers may be provided on the test circuit elements 120_*a*. A first contact plug 120_*c* and a second contact plug 120_*d* that are connected to the test circuit may be included in the interlayer insulating layer ILD. For example, the first and second contact plugs 120_*c* and 120_*d* may extend from the test circuit lines 120_*b* to an upper surface of the interlayer insulating layer IL. Upper surfaces of the first and second contact plugs 120_*c* and 120_*d* may be coplanar with an upper surface of the interlayer insulating layer IL.

A bit line connection via BCV and a test pad connection via TCV may be provided on the interlayer insulating layer ILD. The bit line connection via BCV may be electrically connected to the first contact plug 120_*c*, and the test pad connection via TCV may be electrically connected to the second contact plug 120_*d*. For example, a lower surface of the bit line connection via BCV may contact the upper surface of the first contact plug 120_*c*, and a lower surface of the test pad connection via TCV may contact the upper surface of the second contact plug 120_*d*.

The bit line connection via BCV may be electrically connected to the bit line connection line BCL. For example, an upper surface of the bit line connection via BCV may contact a lower surface of the bit line connection line BCL. The test circuit may be electrically connected to the bit line BL of the memory cell array through the first contact plug 120_*c*, the bit line connection via BCV, and the bit line connection line BCL.

A second upper line UIL2, a test plug TPG, and a test pad TPAD may be provided on the test pad connection via TCV. For example, a lower surface of the second upper line UIL2 may contact an upper surface of the test pad connection via TCV, a lower surface of the test plug TPG may contact an upper surface of the second upper line UIL2, and a lower surface of the test pad TPAD may contact an upper surface of the test plug TPG. The test circuit elements 120_*a* may be connected to the test pad TPAD through the second contact plug 120_*d*, the test pad connection via TCV, the second upper line UIL2, and the test plug TPG.

Figure 11:
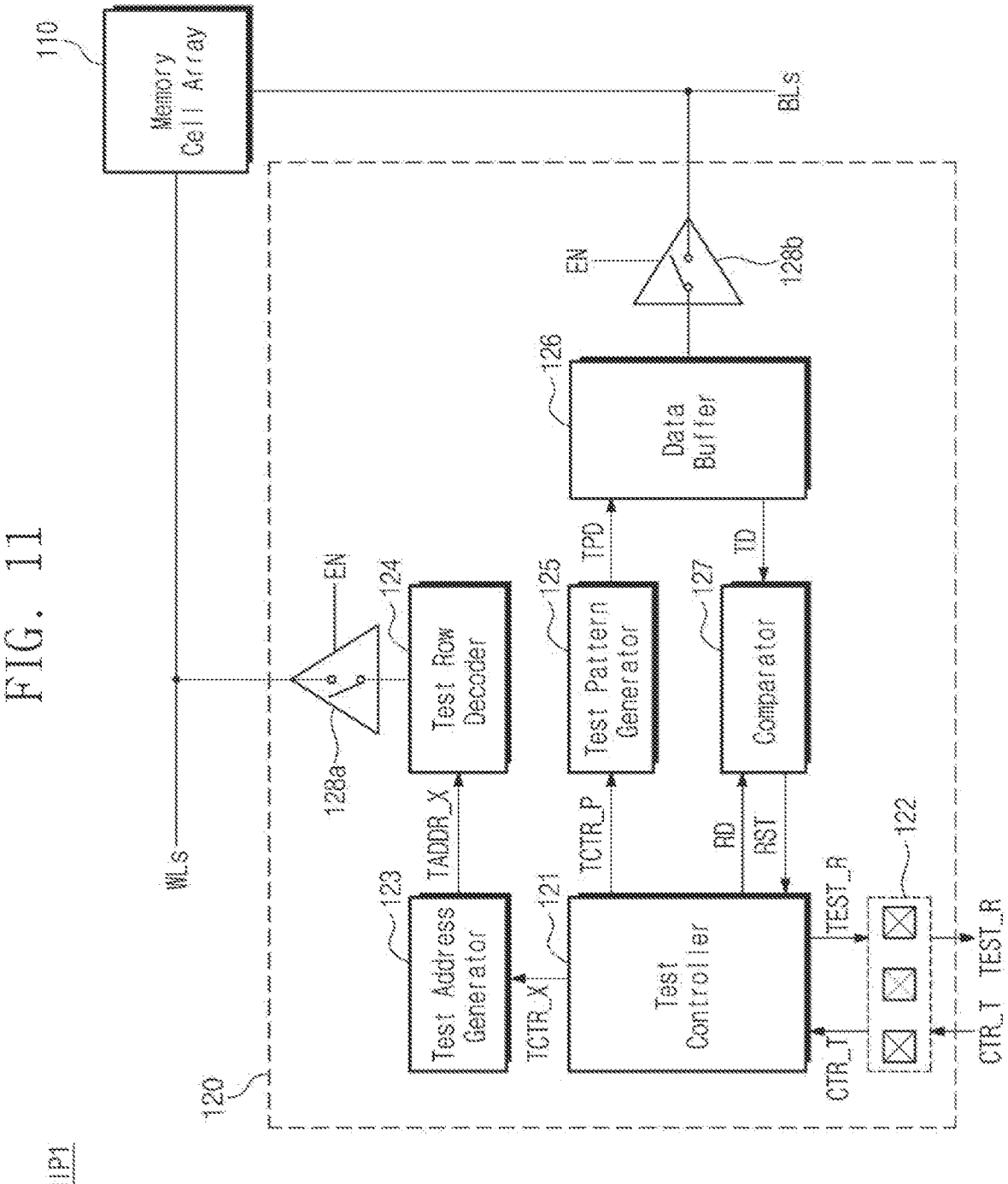
FIG. 11 illustrates a test circuit and a memory cell array of a memory chip according to an example embodiment of the present disclosure.

FIG. 11 illustrates a test circuit and a memory cell array of a memory chip according to an example embodiment of the present disclosure.

Referring to FIG. 11, the test circuit 120 may include a test controller 121, test pads 122, a test address generator 123, a test row decoder 124, a test pattern generator 125, a data buffer 126, a comparator 127, and first and second state buffers 128*a* and 128*b*. In an embodiment, the test circuit 120 may be configured to perform the test process on the memory cell array 110 based on the control signal CTR_T received from the test pads 122. The test processes performed by the test circuit 120 may include an EDS process such as those described herein.

The test pads 122 may be configured to receive the control signal CTR_T from the external test device. Each of the test pads 122 may correspond to the test pad TPAD of FIG. 10. The control signal CTR_T may include a plurality of information for performing the test process. For example, the control signal CTR_T may include signals for controlling a test operation mode. The control signal CTR_T received through the test pads 122 may be provided to the test controller 121.

The test controller 121 may be configured to generate a test control signal based on the control signal CTR_T. The test control signal may include a test address generation signal TCTR_X, a test pattern generation signal TCTR_P, test reference data RD, and a test enable signal EN. The test address generation signal TCTR_X may be provided to the test address generator 123, the test pattern generation signal TCTR_P may be provided to the test pattern generator 125, the test reference data RD may be provided to the comparator 127, and the test enable signal EN may be provided to the first and second state buffers 128*a* and 128*b*.

The test address generator 123 may be configured to generate a test row address TADDR_X based on the test address generation signal TCTR_X. The test row address TADDR_X may be used to select one of the word lines WLs of the memory cell array 110. In an embodiment, the test address generator 123 may generate the test row address TADDR_X based on the test address generation signal TCTR_X, so as to cause the test row address TADDR_X to be increased sequentially. The test row address TADDR_X generated by the test address generator 123 may be provided to the test row decoder 124.

The test row decoder 124 may be configured to select one of the plurality of word lines WLs based on the test row address TADDR_X. The test process may be performed on memory cells corresponding to the word line selected by the test row decoder 124.

The test pattern generator 125 may be configured to generate test pattern data TPD based on the test pattern generation signal TCTR_P. The test pattern data TPD may include data information to be programmed in a plurality of memory cells. The test pattern data TPD generated by the test pattern generator 125 may be provided to the data buffer 126.

The data buffer 126 may be configured to temporarily store the test pattern data TPD received from the test pattern generator 125. The data buffer 126 may provide the stored test pattern data TPD to the memory cell array 110 through the bit lines BLs. The test pattern data TPD may be input and programmed in the memory cells corresponding to the word line selected by the test row decoder 124.

The data buffer 126 may be configured to temporarily store test data TD read from the memory cell array 110. The data buffer 126 may provide the stored test data TD to the comparator 127.

The comparator 127 may be configured to receive the test reference data RD from the test controller 121 and to receive the test data TD from the data buffer 126. The comparator 127 may compare the test reference data RD and the test data TD and may generate the comparison result RST. In an embodiment, when the test reference data RD and the test data TD are matched, the comparison result RST may have a first value. When the test reference data RD and the test data TD are not matched, the comparison result RST may have a second value different from the first value. The comparison result RST generated by the comparator 127 may be provided to the test controller 121.

The test controller 121 may be configured to determine whether the memory cells of the selected word line are defective, based on the comparison result RST. In an embodiment, when the comparison result RST has the first value, the test controller 121 may determine that the memory cells of the selected word line are normal. In an embodiment, when the comparison result RST has the second value, the test controller 121 may determine that the memory cells of the selected word line are defective. The test controller 121 may provide a determination result to the external test device through the test pads 122.

The first and second state buffers 128a and 128b may include the first state buffer 128a and the second state buffer 128b. The first state buffer 128a may be provided between the test row decoder 124 and the word lines WLs, and the second state buffer 128b may be provided between the data buffer 126 and the bit lines BLs. The first and second state buffers 128a and 128b may be configured to receive the test enable signal EN. In an embodiment, the test enable signal EN may be generated from the test controller 121. In another embodiment, the test enable signal EN may be received from the external test device through the test pads 122.

The first and second state buffers 128a and 128b may be configured to operate in a switch-on state or a switch-off state based on the test enable signal EN.

The switch-on state may include a first logic state and a second logic state. For example, in the first logic state being a high state, a current may be output from the first and second state buffers 128a and 128b to the word lines WLs and the bit lines BLs: in the second logic state being a low state, a current may be output from the word lines WLs and the bit lines BLs to the first and second state buffers 128a and 128b.

In an embodiment, when the test pattern data TPD are input to the memory cell array 110, the first and second state buffers 128a and 128b may be in the first logic state. In an embodiment, when the test data TD are read from the memory cell array 110, the first state buffer 128a may be in the first logic state, and the second state buffer 128b may be in the second logic state.

The switch-off state may be a high-impedance state. In the switch-off state, an input terminal and an output terminal of each of the first and second state buffers 128a and 128b may be electrically insulated from each other.

In an embodiment, after the test process is completed, when the peripheral circuit chip CHIP2 and the memory chip CHIP1 are bonded together, the first and second state buffers 128a and 128b may turn to (or may be set to) the switch-off state.

Figure 12:
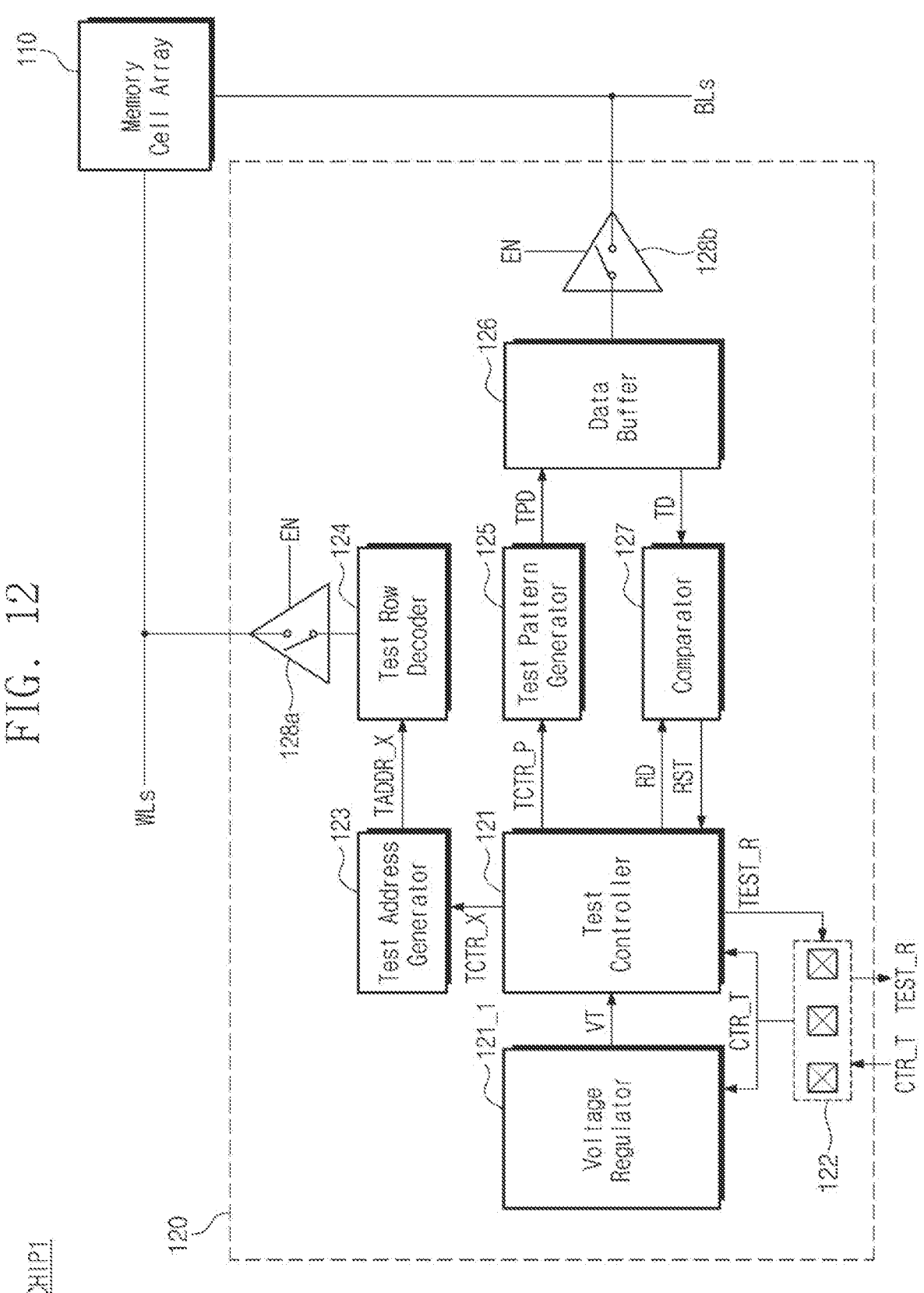
FIG. 12 illustrates a test circuit and a memory cell array of a memory chip according to an example embodiment of the present disclosure.

FIG. 12 illustrates a test circuit and a memory cell array of a memory chip according to an example embodiment of the present disclosure. Below, duplicative descriptions will not be repeated, and differences with FIG. 11 will be mainly described.

Referring to FIG. 12, the test circuit 120 may further include a voltage regulator 121_1. The voltage regulator 121_1 may be configured to receive the control signal CTR_T from the test pads 122. The control signal CTR_T may include a voltage signal for the operation of the test circuit 120.

The voltage regulator 121_1 may be configured to generate a driving voltage VT, which is necessary for the test circuit 120 to operate, based on the voltage signal. The voltage regulator 121_1 may provide the driving voltage VT to the test controller 121. In an embodiment, the driving voltage VT generated by the voltage regulator 121_1 may be smaller than a voltage of the voltage signal. The driving voltage VT generated by the voltage regulator 121_1 may be provided to circuits constituting the test circuit 120 through the test controller 121.

Figure 13:
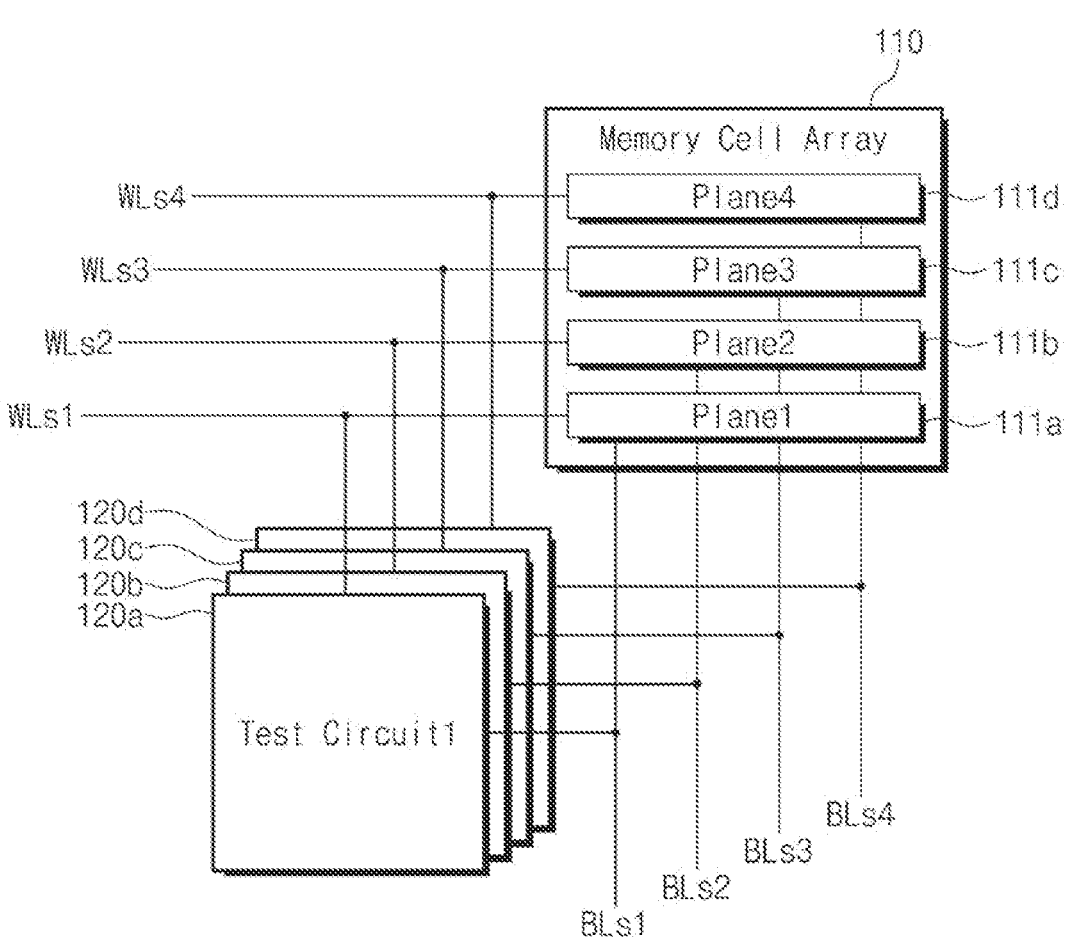
FIG. 13 illustrates a test circuit and a memory cell array of a memory chip according to an example embodiment of the present disclosure.

FIG. 13 illustrates a test circuit and a memory cell array of a memory chip according to an example embodiment of the present disclosure.

Referring to FIG. 13, the memory cell array 110 may include a plurality of planes. For example, the memory cell array 110 may include first to fourth planes 111a, 111b, 111c, and 111d. Each of the first to fourth planes 111a, 111b, 111c, and 111d may include a plurality of memory blocks.

The first plane 111a may be connected to first word lines WLs1 and first bit lines BLs1. The second plane 111b may be connected to second word lines WLs2 and second bit lines BLs2. The third plane 111c may be connected to third word lines WLs3 and third bit lines BLs3. The fourth plane 111d may be connected to fourth word lines WLs4 and fourth bit lines BLs4.

A plurality of test circuits connected to a plurality of planes may be provided. For example, first to fourth test circuits 120a, 120b, 120c, and 120d may be provided.

The first test circuit 120a may be connected to the first word lines WLs1 and the first bit lines BLs1. The second test circuit 120b may be connected to the second word lines WLs2 and the second bit lines BLs2. The third test circuit 120c may be connected to the third word lines WLs3 and the third bit lines BLs3. The fourth test circuit 120*d* may be connected to the fourth word lines WLs4 and the fourth bit lines BLs4.

Each of the first to fourth test circuits 120*a*, 120*b*, 120*c*, and 120*d* may be substantially the same as the test circuit 120 of FIG. 11. The test process for the first plane 111*a* may be performed by the first test circuit 120*a*. The test process for the second plane 111*b* may be performed by the second test circuit 120*b*. The test process for the third plane 111*c* may be performed by the third test circuit 120*c*. The test process for the fourth plane 111*d* may be performed by the third test circuit 120*d*. The test processes performed by the first to fourth test circuits 120*a*, 120*b*, 120*c*, and 120*d* may include an EDS process such as those described herein.

In an example embodiment, the first to fourth test circuits 120*a*, 120*b*, 120*c*, and 120*d* may operate at the same time. As the test processes for a plurality of planes are simultaneously performed, a time taken to perform the test process may decrease. In other example embodiments, the first to fourth test circuits 120*a*, 120*b*, 120*c*, and 120*d* may operate sequentially.

Figure 14:
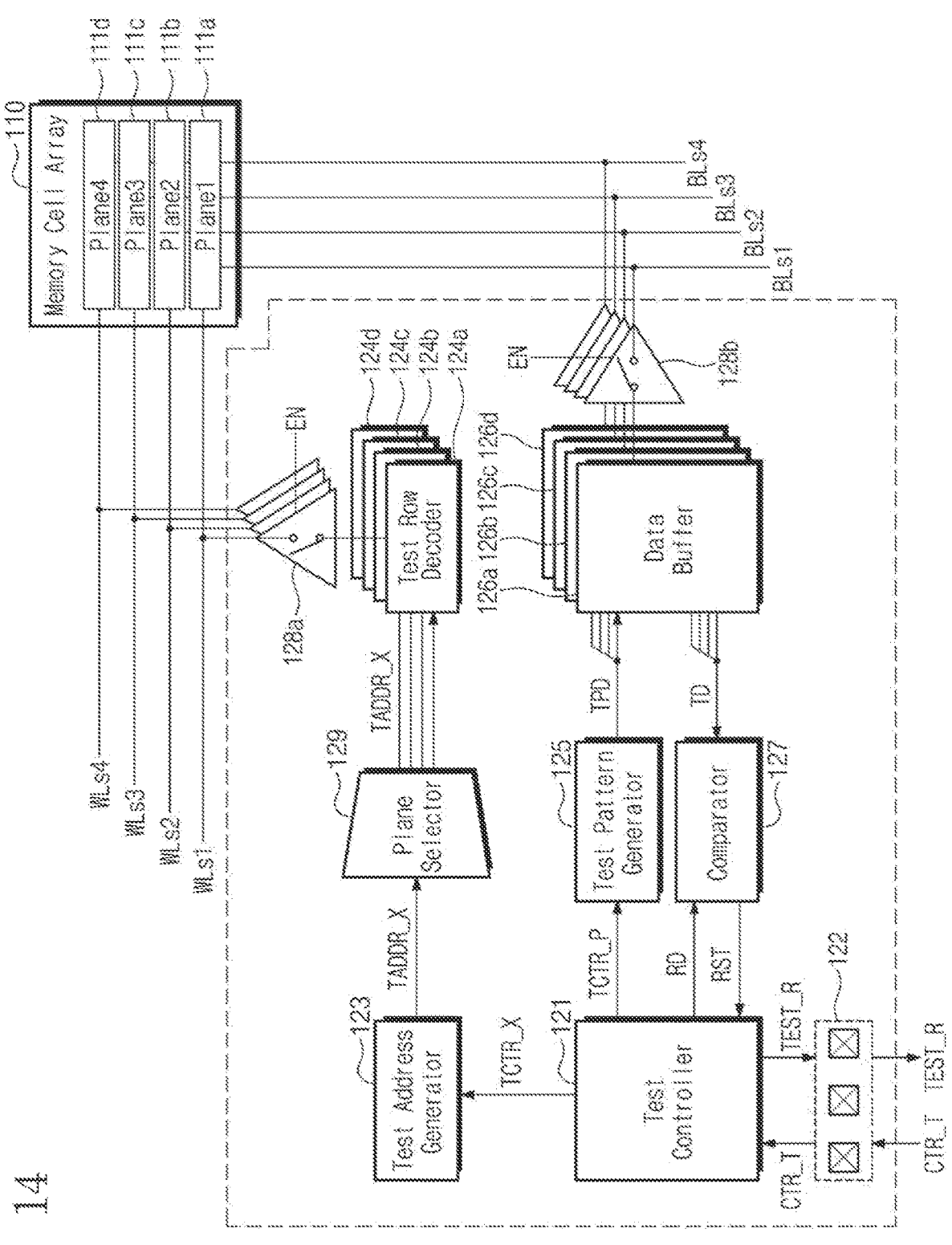
FIG. 14 illustrates a test circuit and a memory cell array of a memory chip according to an example embodiment of the present disclosure.

FIG. 14 illustrates a test circuit and a memory cell array of a memory chip according to an example embodiment of the present disclosure. Below, duplicative descriptions will not be repeated, and differences with FIG. 11 will be mainly described.

Referring to FIG. 14, the memory cell array 110 may include a plurality of planes. For example, the memory cell array 110 may include the first to fourth planes 111*a*, 111*b*, 111*c*, and 111*d*. The memory cell array 110 may be substantially the same as that illustrated in FIG. 13.

The test circuit 120 may include a plurality of test row decoders, a plurality of data buffers, and a plurality of first state buffers 128*a*, and a plurality of second state buffers 128*b*. The plurality of test row decoders may include first to fourth test row decoders 124*a*, 124*b*, 124*c*, and 124*d*. The plurality of data buffers may include first to fourth data buffers 126*a*, 126*b*, 126*c*, and 126*d*.

The first test row decoder 124*a* may be connected to the first word lines WLs1 through the first state buffers 128*a*. The second test row decoder 124*b* may be connected to the second word lines WLs2 through the first state buffers 128*a*. The third test row decoder 124*c* may be connected to the third word lines WLs3 through the first state buffers 128*a*. The fourth test row decoder 124*d* may be connected to the fourth word lines WLs4 through the first state buffers 128*a*.

The first data buffer 126*a* may be connected to the first bit lines BLs1 through the second state buffers 128*b*. The second data buffer 126*b* may be connected to the second bit lines BLs2 through the second state buffers 128*b*. The third data buffer 126*c* may be connected to the third bit lines BLs3 through the second state buffers 128*b*. The fourth data buffer 126*d* may be connected to the fourth bit lines BLs4 through the second state buffers 128*b*.

Unlike the test circuit 120 of FIG. 11, the test circuit 120 of FIG. 14 may further include a plane selector 129. The plane selector 129 may be configured to select one of the first to fourth test row decoders 124*a*, 124*b*, 124*c*, and 124*d*. The test row address TADDR_X generated by the test address generator 123 may be provided to the first to fourth test row decoders 124*a*, 124*b*, 124*c*, or 124*d* selected by the plane selector 129.

In an example embodiment, the plane selector 129 may be configured to sequentially select the first to fourth test row decoders 124*a*, 124*b*, 124*c*, and 124*d*. In such an embodiment, the test processes for a plurality of planes (e.g., the first to fourth planes 111*a*, 111*b*, 111*c*, and 111*d*) may be sequentially performed. In another example embodiment, the plane selector 129 may be configured to simultaneously select the first to fourth test row decoders 124*a*, 124*b*, 124*c*, and 124*d*. In such an embodiment, the test processes for a plurality of planes (e.g., the first to fourth planes 111*a*, 111*b*, 111*c*, and 111*d*) may be sequentially performed.

In another embodiment, the plane selector 129 may be configured to select one of the first to fourth test row decoders 124*a*, 124*b*, 124*c*, and 124*d* based on the control signal CTR_T.

In an embodiment, the test processes for a plurality of planes may be performed by using a single test circuit. Accordingly, the size of the memory chip in which the test circuit for the plurality of planes is disposed may be reduced.

Figure 15:
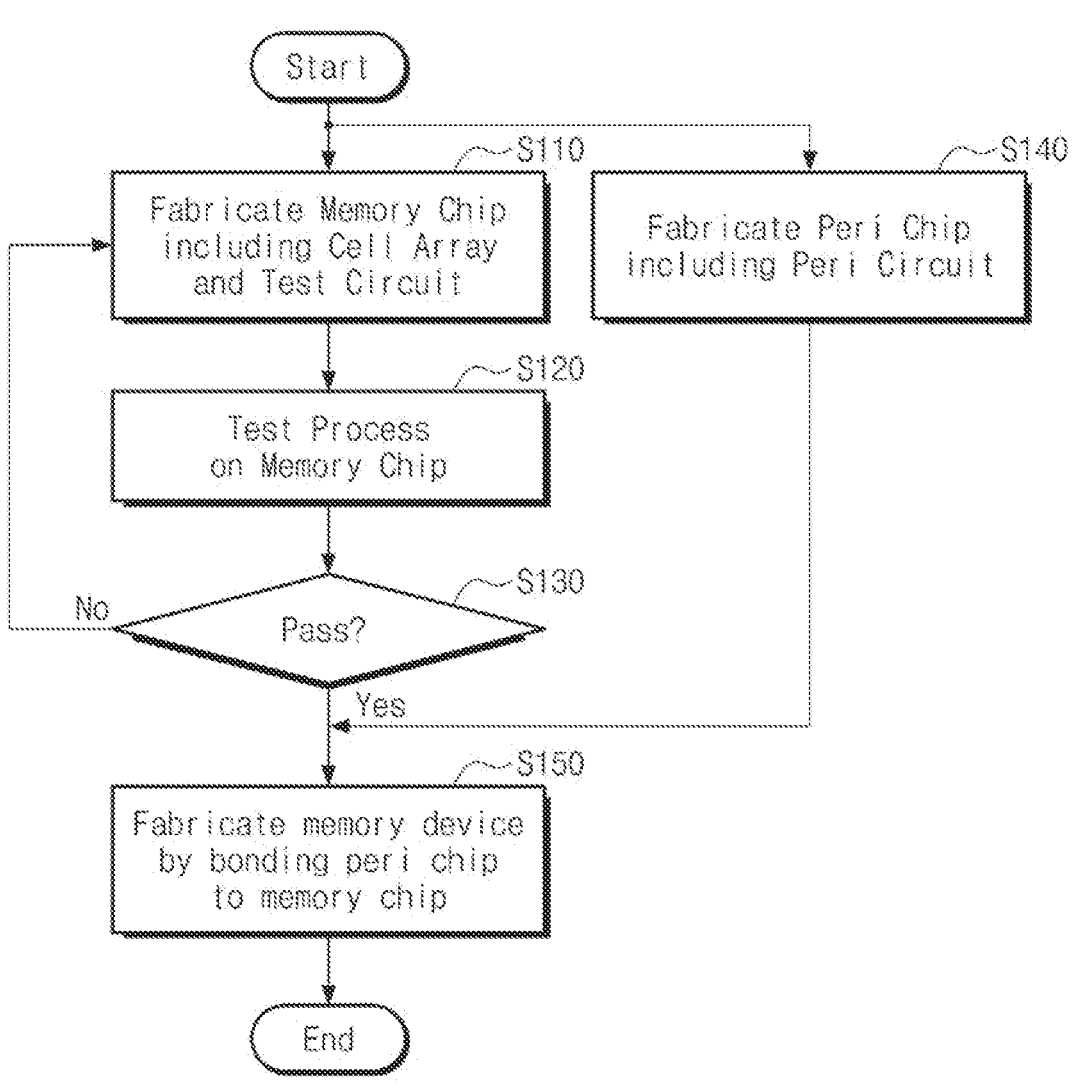
FIG. 15 is a flowchart illustrating a method of fabricating a memory device according to an example embodiment of the present disclosure.

FIG. 15 is a flowchart illustrating a method of fabricating a memory device, according to an example embodiment of the present disclosure.

Referring to FIG. 15, in operation S110, the memory chip CHIP1 including a three-dimensional cell array is fabricated. For example, the memory chip CHIP1 may correspond to the memory chip CHIP1 of FIG. 7. In operation S120, the test process is performed on the memory chip CHIP1. The test process may include an EDS process. In operation S130, whether the memory chip CHIP1 passes the test process is determined. When it is determined that the memory chip CHIP1 passes the test process, operation S150 is performed. Meanwhile, when it is determined that the memory chip CHIP1 fails to pass the test process, operation S110 is again performed.

A semiconductor process may sequentially include a wafer process, an oxidation process, a photolithography process, an etching process, a thin film process, a metal wiring process, a test process, and a packaging process: in this case, the test process and the packaging process are referred to as a "post-process". The test process that is a process of selecting good/defective semiconductor chips through the test of semiconductor chips after a semiconductor fabricating process may be performed by contacting a wafer to a probe card.

The test process may include an EDS process. The test process includes a first step that includes an electrical (ET) test in which parameters of an individual device, such as an electrical DC voltage and a current characteristic, are tested to determine whether the individual device operates and a wafer burn-in step in which a potential defect factor of the product is detected by applying an AC/DC voltage thereto in a state where a wafer is heated at a given temperature. In addition, the test process may further include a second step corresponding to a pre-laser step or a hot/cold test step in which whether each chip on the wafer is normal at a specific temperature is determined through an electrical signal. Also, the test process may further include a third step corresponding to a laser repair and post-laser step in which chips that are determined as defective in the pre-laser step but are determined to be repairable are collected and are repaired by using a laser beam. In addition, the test process may further include a fourth step corresponding to a tape laminate and bake grinding step. Furthermore, the test process may further include a fifth step corresponding to an inking step for visually identifying defective chips by applying the special ink to the defective chips screened in the pre-laser step and the post-laser step. According to embodiments, operation S120 and operation S130 may correspond to at least one of the first to fifth steps. In an embodiment, the test process performed in operation S120 will be described in detail with reference to FIG. 16.

In operation S140, the peripheral circuit chip CHIP2 including a peripheral circuit(s) is fabricated. For example, the peripheral circuit chip CHIP2 may correspond to the peripheral circuit chip CHIP2 of FIGS. 1 and 7. Operation S110 and operation S140 may be performed substantially simultaneously. However, the present disclosure is not limited thereto. For example, operation S140 may be performed at the same time as an arbitrary operation before operation S150. In operation S150, the memory device 100 is fabricated by bonding the memory chip CHIP1 and the peripheral circuit chip CHIP2 together. For example, the memory device 100 may correspond to the memory device 100 of FIG. 2.

Figure 16:
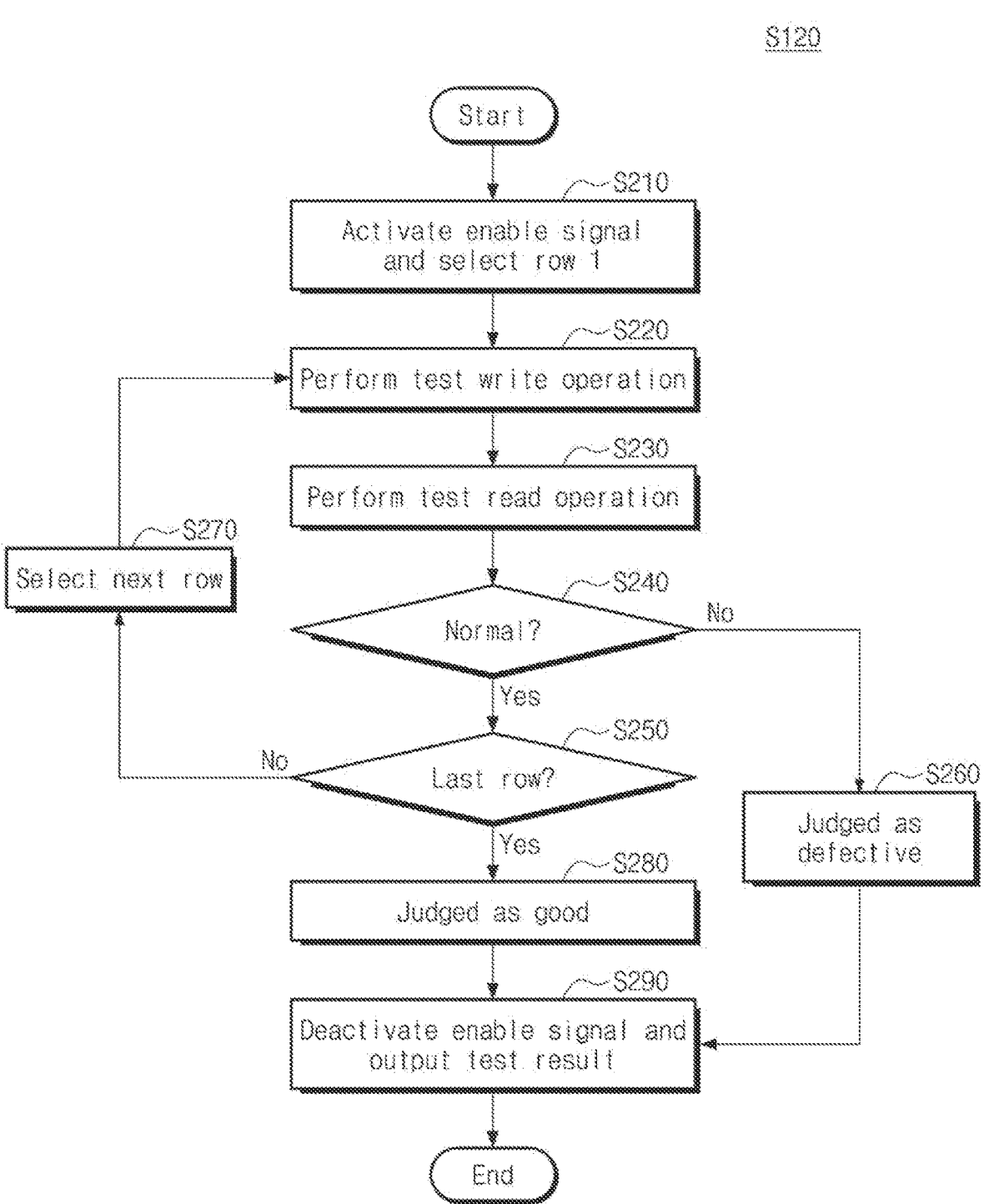
FIG. 16 is a flowchart illustrating a test process method for a memory chip performed in operation S120 of FIG. 15 according to an example embodiment of the present disclosure.

FIG. 16 is a flowchart illustrating a test process method for a memory chip performed in operation S120 of FIG. 15. Below, the test process method will be described with reference to FIG. 11 together.

Referring to FIGS. 11 and 16, in operation S210, the control signal CTR_T input to the test controller 121 may include information for activating the test enable signal EN. The test controller 121 may activate the test enable signal EN based on the control signal CTR_T. When the test enable signal EN is activated, the first and second state buffers 128a and 128b may switch to the switch-on state. In operation S210, a word line of a first row may be selected by the test row decoder 124.

In operation S220, the control signal CTR_T input to the test controller 121 may include information for operating in a test write mode MODE1. The test controller 121 may perform a test write operation in the test write mode MODE1, based on the control signal CTR_T.

In the test write mode MODE1, the first and second state buffers 128a and 128b may be switched on to operate in the first logic state. The test controller 121 may provide the test pattern generation signal TCTR_P to the test pattern generator 125, and the test pattern generator 125 may provide the test pattern data TPD to the data buffer 126 based on the test pattern generation signal TCTR_P. The data buffer 126 may provide the stored test pattern data TPD to the memory cell array 110 through the second state buffer 128b and the bit lines BLs. As such, the test pattern data TPD may be input and programmed in memory cells corresponding to the word line selected by the test row decoder 124.

In operation S230, the control signal CTR_T input to the test controller 121 may include information for operating in a test read mode MODE2. The test controller 121 may perform a test read operation in the test read mode MODE2, based on the control signal CTR_T.

In the test read mode MODE2, the first state buffer 128a may be switched on to operate in the first logic state, and the second state buffer 128b may be switched on to operate in the second logic state. The data buffer 126 may be configured to temporarily store the test data TD from the memory cell array 110.

In operation S240, the test controller 121 may provide the test reference data RD to the comparator 127. The data buffer 126 may provide the stored test data TD to the comparator 127. The comparator 127 may compare the test reference data RD and the test data TD and may generate the comparison result RST. The test controller 121 may determine whether the memory cells are normal, based on the comparison result RST. For example, when the comparison result RST has the first value, the test controller 121 performs operation S250. For example, when the comparison result RST has the second value, the test controller 121 may perform operation S260 and may determine that the memory cells are defective.

In operation S250, the test controller 121 may determine whether the selected word line is the last row.

When the selected word line is not the last row, operation S270 may be performed. In operation S270, the test address generator 123 may generate a row address for selecting a word line of a next row. After operation S270 is performed, the method may proceed to operation S220 such that operation S220 to operation S250 are repeatedly performed.

When the selected word line is the last row, operation S280 may be performed. In operation S280, the test controller 121 may determine that the memory cell array 110 operates normally, that is, is good.

In operation S290, the test enable signal EN may be deactivated based on the control signal CTR_T input to the test pads 122. In an embodiment, the test controller 121 may deactivate the test enable signal EN. The test controller 121 may output a test result including information indicating whether the memory cell array 110 is good or defective.

According to an embodiment of the present disclosure, there is provided a memory device capable of improving a memory device yield by performing a test process on a memory chip before bonding the memory chip to a peripheral circuit chip.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:
   a memory chip including:
      a memory cell array connected to word lines and bit lines;
      a test circuit connected to the word lines and the bit lines, the test circuit being disposed in a test circuit region that surrounds the memory cell array; and
      a first bonding metal pattern connected to the word lines and the bit lines; and
      a bit line connection line contacting upper surfaces of the bit lines and extending into the test circuit region, and
   a peripheral circuit chip including a peripheral circuit and a second bonding metal pattern,
   wherein the test circuit is configured to perform a test process on the memory cell array, and
   wherein the memory chip and the peripheral circuit chip are connected in a bonding method for electrically connecting the first bonding metal pattern and the second bonding metal pattern.

2. The memory device of claim 1, wherein the bonding method is a Cu—Cu bonding method.

3. The memory device of claim 1,
   wherein the test circuit includes:
      a first state buffer connected to the word lines; and
      a second state buffer connected to the bit lines, and
   wherein the test circuit performs the test process on the memory cell array before bonding the peripheral circuit chip and the memory chip together.

4. The memory device of claim 3, wherein the test process includes an electrical die sorting (EDS) process.

5. The memory device of claim 3, wherein the test circuit includes:
   a test pad configured to receive a control signal from an external test device; and

a test controller configured to generate a test control signal based on the control signal received from the test pad.

6. The memory device of claim 5, wherein the test circuit further includes:
    a test address generator configured to generate a test row address; and
    a test row decoder configured to select one of the word lines based on the test row address, and
wherein the test circuit is configured to perform the test process on memory cells corresponding to the one of the word lines selected by the test row decoder.

7. The memory device of claim 5, wherein the test control signal includes a test pattern generation signal and test reference data, wherein the test circuit further includes:
    a test pattern generator configured to generate test pattern data based on the test pattern generation signal;
    a data buffer configured to provide the test pattern data to the memory cell array and to receive test data from the memory cell array; and
    a comparator configured to compare the test reference data and the test data and to generate a comparison result, and
wherein the test controller is configured to determine whether the memory cells of the memory cell array are defective, based on the comparison result.

8. The memory device of claim 1, wherein the memory cell array includes a three-dimensional cell array including a plurality of memory blocks, and
wherein each of the plurality of memory blocks includes a plurality of vertical NAND strings.

9. The memory device of claim 8, wherein the peripheral circuit includes:
    a control logic circuit configured to generate a row address;
    a row decoder configured to select one of the word lines of the memory cell array based on the row address; and
    a page buffer connected to the memory cell array through the bit lines.

10. The memory device of claim 1, wherein an operating voltage of the test circuit is smaller than an operating voltage of the peripheral circuit.

11. A memory chip includes:
    a cell array placement region in which a memory cell array including word lines and bit lines is disposed;
    a test circuit region surrounding the cell array placement region and in which is disposed, a test circuit configured to perform a test process on the memory cell array; and
    a bit line connection line provided on the bit lines and contacting upper surfaces of the bit lines,
wherein the test circuit is electrically connected to the bit lines through the bit line connection line, and
wherein the bit line connection line is configured to extend from the cell array placement region into at least a portion of the test circuit region.

12. The memory chip of claim 11, wherein a test pad configured to receive a control signal for performing the test process from an external test device.

13. The memory chip of claim 12, wherein the test circuit includes:
    a test controller configured to generate a test control signal based on the control signal received from the test pad.

14. The memory chip of claim 13, wherein the test circuit includes:
    a test address generator configured to generate a test row address; and
    a test row decoder configured to select one of the word lines based on the test row address, and
wherein the test circuit is configured to perform the test process on memory cells of the memory cell array corresponding to the one of the word lines selected by the test row decoder.

15. The memory chip of claim 11, wherein the memory cell array includes a three-dimensional cell array including a plurality of memory blocks, and
wherein each of the plurality of memory blocks includes a plurality of vertical NAND strings.

16. A method of fabricating a memory device, the method comprising:
    fabricating a memory chip including a memory cell array and a test circuit;
    fabricating a peripheral circuit chip including a peripheral circuit;
    performing a test process on the memory cell array; and
    when the memory chip passes the test process, bonding the peripheral circuit chip and the memory chip together to fabricate the memory device,
wherein the memory cell array is a three-dimensional memory cell array.

17. The method of claim 16, wherein the test process includes an electrical die sorting (EDS) process.

18. The method of claim 16, wherein the test circuit is configured to perform the test process on the memory cell array.

19. The method of claim 18, wherein the test circuit includes:
    a test pad configured to receive a control signal from an external test device; and
    a test controller configured to generate a test control signal based on the control signal received from the test pad.

20. The method of claim 19, wherein the memory cell array includes word lines, wherein the test circuit further includes:
    a test address generator configured to generate a test row address; and
    a test row decoder configured to select one of the word lines based on the test row address, and
wherein the test circuit is configured to perform the test process on memory cells corresponding to the one of the word lines selected by the test row decoder.

* * * * *